(12) United States Patent
Uchikawa et al.

(10) Patent No.: US 7,979,777 B2
(45) Date of Patent: Jul. 12, 2011

(54) APPARATUS, METHOD AND PROGRAM FOR DECODING

(75) Inventors: Hironori Uchikawa, Kawasaki (JP); Kohsuke Harada, Yokohama (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 1149 days.

(21) Appl. No.: 11/723,336

(22) Filed: Mar. 19, 2007

(65) Prior Publication Data

US 2008/0005641 A1 Jan. 3, 2008

(30) Foreign Application Priority Data

Jul. 3, 2006 (JP) ................................. 2006-183659

(51) Int. Cl.
*H03M 13/00* (2006.01)
(52) U.S. Cl. .......................... 714/758; 714/776; 714/784
(58) Field of Classification Search .................. 714/758, 714/776, 784, 11, 31, 4, 727
See application file for complete search history.

(56) References Cited

U.S. PATENT DOCUMENTS

| 5,560,036 | A | * | 9/1996 | Yoshida ........................ 712/227 |
| 5,835,697 | A | * | 11/1998 | Watabe et al. .................. 714/11 |
| 6,073,249 | A | * | 6/2000 | Watabe et al. ..................... 714/4 |
| 2005/0268204 | A1 | | 12/2005 | Harada |

FOREIGN PATENT DOCUMENTS

| JP | 2005-506733 | 3/2005 |
| JP | 2005-347883 | 12/2005 |

OTHER PUBLICATIONS

J. Zhang et al., "Shuffled Iterative Decoding," IEEE Transactions on Communications, vol. 53, No. 2, pp. 209-213 (Feb. 2005).
Yoshihiro Kurihara et al., "Performance Evaluation of Ordered Sum-Product Algorithm", Report on Technical Research of IEICE, The Institute of Electronics, Information and Communication Engineers, Mar. 2004, IT 2003-75, pp. 13-18, Abstract.
Notification of Reasons for Rejection, Japanese Patent Application No. 2006-183659, mailed Sep. 30, 2008.

* cited by examiner

*Primary Examiner* — Fritz Alphonse
(74) *Attorney, Agent, or Firm* — Finnegan, Henderson, Farabow, Garrett & Dunner, L.L.P.

(57) ABSTRACT

A decoder is configured to include an acquisition-unit configured to acquire first respective likelihoods of data-bits and second respective likelihoods of parity-bits. The data-bits and the parity-bits are included in code data obtained by LDPC-encoding the data-bits with a low density parity check matrix. The decoder also includes a detecting-unit configured to detect reliabilities of the first respective likelihoods and the second respective likelihoods. The decoder also includes a forming-unit configured to form an update schedule representing an order of updating the first and second respective likelihoods in order of increasing reliability, in accordance with the reliabilities. The decoder also includes an updating-unit configured to update the first and second respective likelihoods in the order represented by the update schedule, with the low density parity check matrix. The decoder also includes a discriminating-unit configured to execute hard decision of the likelihoods updated by the updating-unit. The decoder also includes a checking-unit configured to execute parity check of a discrimination result of the discriminating-unit, to obtain the code data.

23 Claims, 15 Drawing Sheets

|       | Data bits |       |       |       | Parity bits |       |       |       |
|-------|-----------|-------|-------|-------|-------------|-------|-------|-------|
|       | $c_1$     | $c_2$ | $c_3$ | $c_4$ | $c_5$       | $c_6$ | $c_7$ | $c_8$ |
|       | 1         | 1     |       |       | 1           |       |       |       |
|       |           | 1     | 1     |       |             | 1     |       |       |
|       | 1         |       | 1     | 1     | 1           | 1     | 1     |       |
|       |           | 1     |       |       |             | 1     |       | 1     |
| Column weight | 2 | 3 | 2 | 1 | 3 | 2 | 1 | 1 |

| | $F_1$ | $F_2$ | $F_3$ | $F_4$ | $F_5$ | $F_6$ | $F_7$ | $F_8$ |
|---|---|---|---|---|---|---|---|---|
| Inputs | 0.74 | 1.2 | -0.1 | x | 1.32 | 0.6 | x | x |
| Outputs | 0.74 | 1.2 | -0.1 | 0.0 | 1.32 | 0.6 | 0.0 | 0.0 |

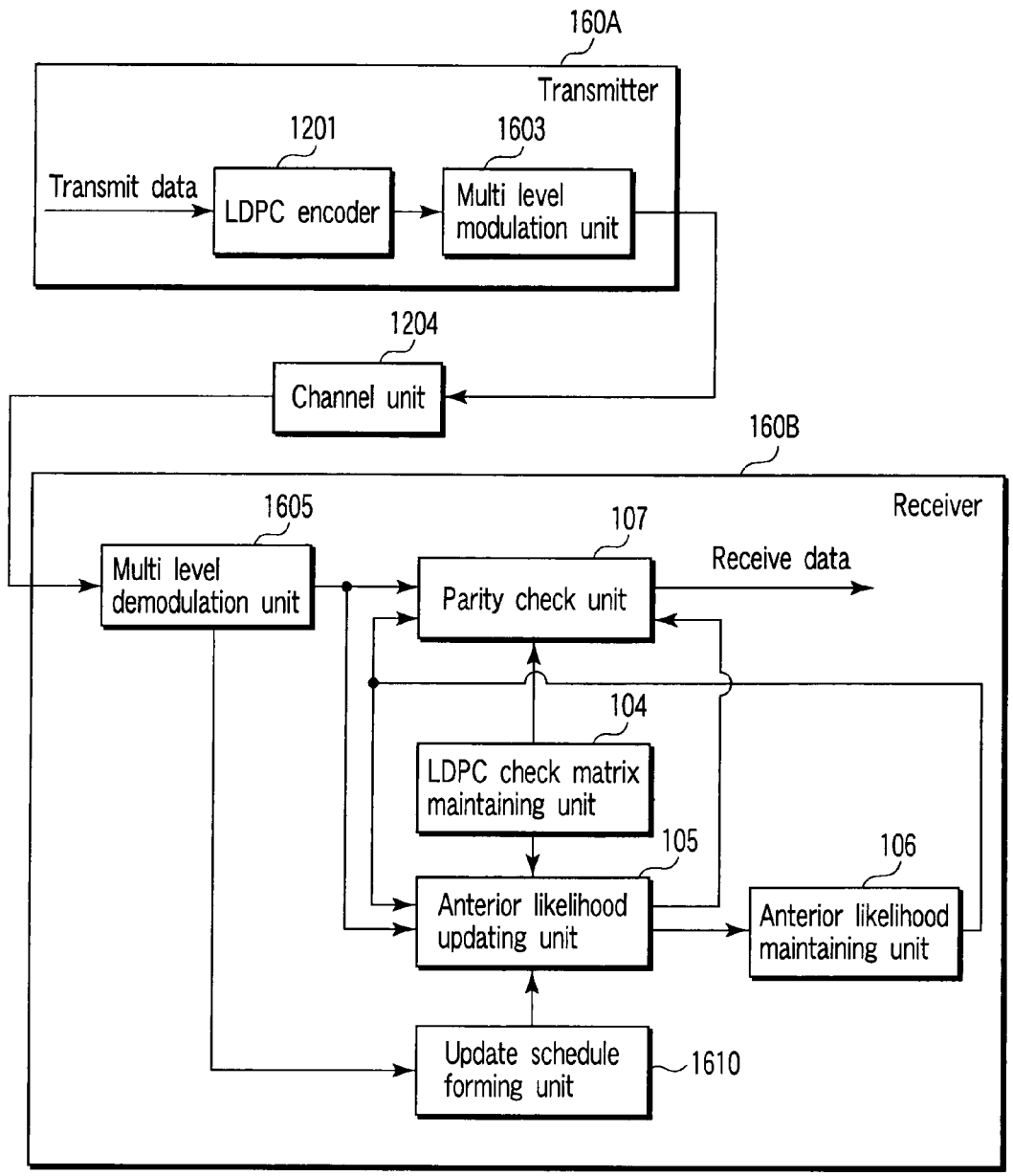
F I G. 16

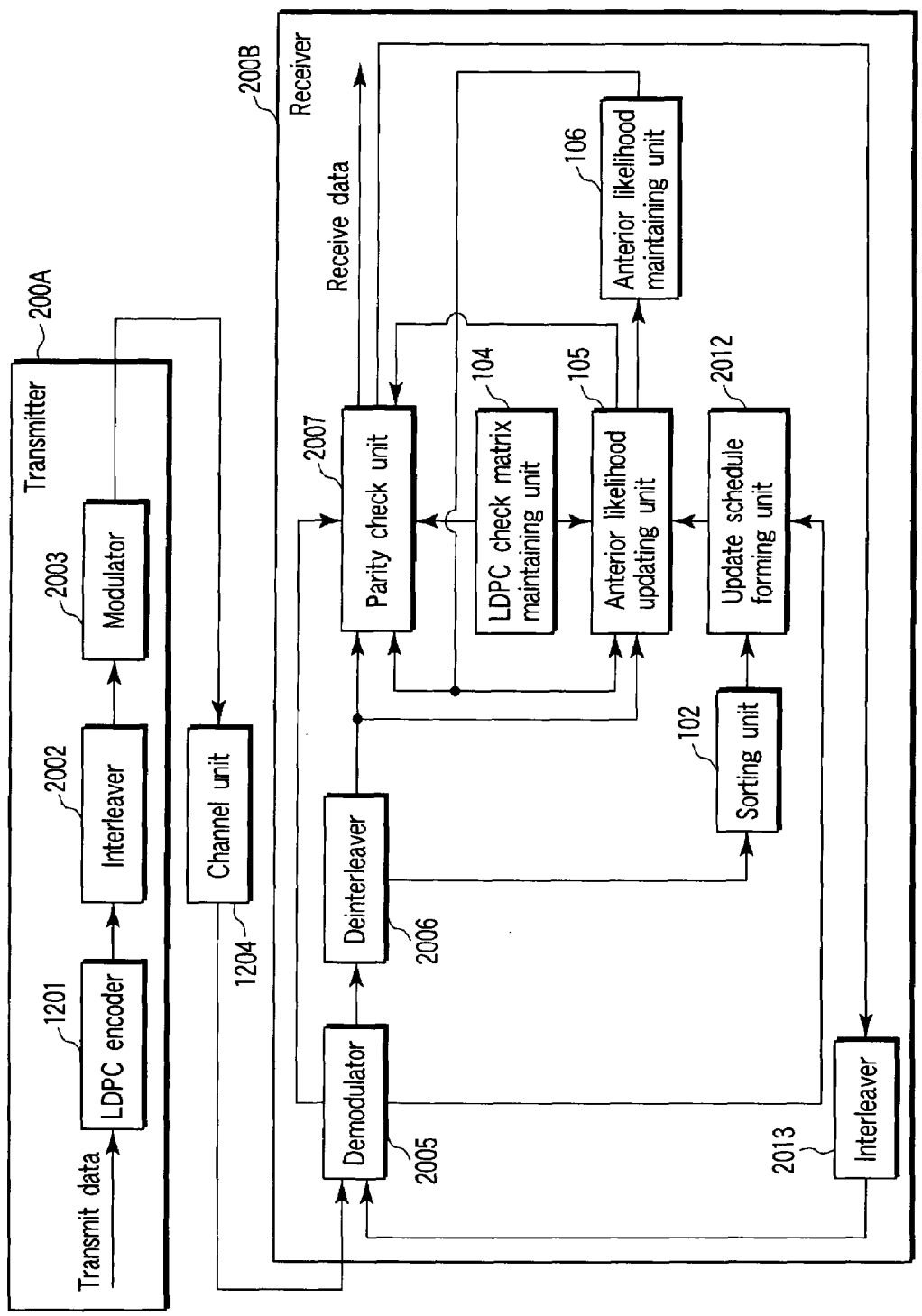
F I G. 20

APPARATUS, METHOD AND PROGRAM FOR DECODING

CROSS-REFERENCE TO RELATED APPLICATIONS

This application is based upon and claims the benefit of priority from prior Japanese Patent Application No. 2006-183659, field Jul. 3, 2006, the entire contents of which are incorporated herein by reference.

BACKGROUND OF THE INVENTION

1. Field of the Invention

This invention relates to a decoder using a Low Density Parity Check (LDPC) codes used in a communication system and recording system.

2. Description of the Related Art

Probability calculations called row-directional processing and column-directional processing are iterated by using a parity check matrix corresponding to the LDPC codes, posterior probabilities of code bits are obtained and the LDPC codes are decoded. The row-directional processing is a processing of obtaining external information using parity check formula of each row of the parity check matrix. The column-directional processing is a processing of obtaining anterior probabilities on the basis of the external information obtained by the row-directional processing. In general, all the columns are subjected to the column-directional processing after the rows of all the parity check matrices are subjected to the row-directional processing.

Recently, shuffled decoding is known as a method of efficiently decoding the LDPC codes (for example, Junta Zhang and Marc. P. C. Fostoria, "Shuffled Iterative Decoding", IEEE Trans. on Common. VOL. 53, NO. 2, pp. 209-213, February 2005). The shuffled decoding can make propagation rate of the external information higher and conduct efficient decoding by alternately conducting the row-directional processing and the column-directional processing at each code bit (i.e. updating the anterior probability of each column).

However, the decoding efficiency of the shuffled decoding, which conducts efficient decoding by alternately conducting the row-directional processing and the column-directional processing at each code bit, depends on the structure of the parity check matrix, the receiving probability of code bits obtained from communication path and recording media, and a sequence (update schedule) of calculating the probability. For this reason, decoding cannot always be conducted efficiently in the conventional method.

BRIEF SUMMARY OF THE INVENTION

An aspect of the present invention is configured to comprise an acquisition unit configured to acquire first respective likelihoods of data bits and second respective likelihoods of parity bits, the data bits and the parity bits included in code data obtained by LDPC-encoding the data bits with a low density parity check matrix, a detecting unit configured to detect reliabilities of the first respective likelihoods and the second respective likelihoods, a forming unit configured to form an update schedule representing an order of updating the first and second respective likelihoods in order of increasing reliability, in accordance with the reliabilities, an updating unit configured to update the first and second respective likelihoods in the order represented by the update schedule, with the low density parity check matrix, a discriminating unit configured to execute hard decision of the likelihoods updated by the updating unit, and a checking unit configured to execute parity check of a discrimination result of the discriminating unit, to obtain the code data.

BRIEF DESCRIPTION OF THE SEVERAL VIEWS OF THE DRAWING

FIG. 16 is a block diagram showing a configuration of a communication system according to the fifth embodiment;

FIG. 20 is a block diagram showing a configuration of a communication system according to the sixth embodiment;

DETAILED DESCRIPTION OF THE INVENTION

Embodiments of the present invention will be explained below with reference to the accompanying drawings.

A configuration relating to decoding alone is explained below, but the decoder also comprises a configuration of an encoder which executes encoding.

Figure 1:
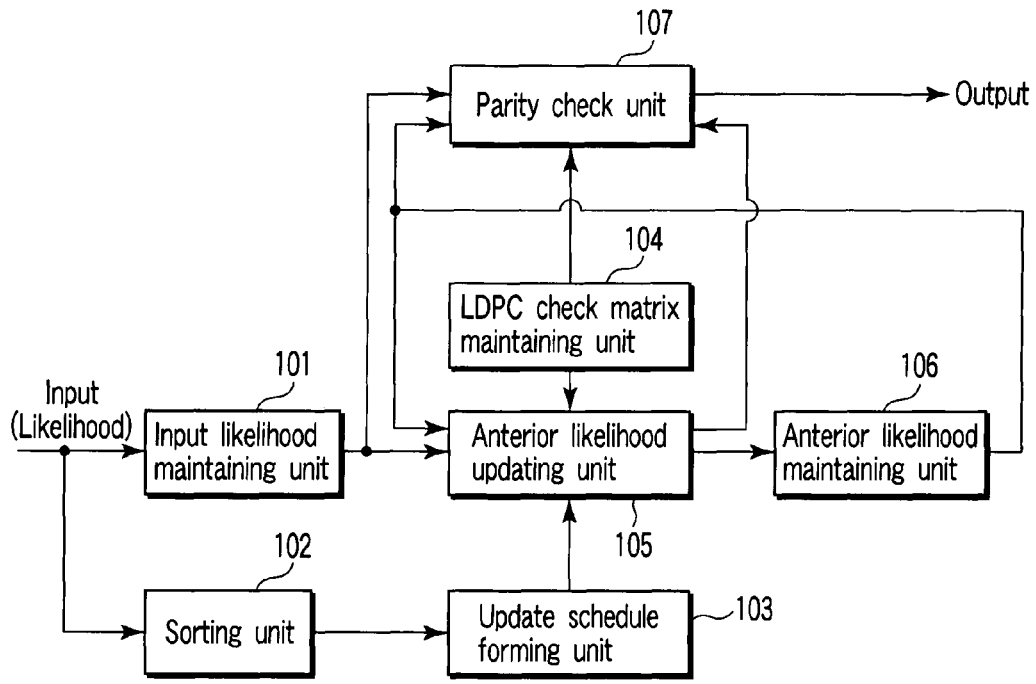
FIG. 1 is a block diagram showing a configuration of a decoder according to the first embodiment.

According to a first embodiment shown in FIG. 1, a decoder comprises an input likelihood maintaining unit 101, a sorting unit 102, an update schedule forming unit 103, an LDPC check matrix maintaining unit 104, an anterior likelihood updating unit 105, an anterior likelihood maintaining unit 106 and a parity check unit 107.

The decoder comprises an input likelihood maintaining unit 101 inputs a likelihood of code data obtained by a signal processor (not shown) of a preceding stage, and maintains the likelihood until decoding the likelihood is completed. The code data is an LDPC code or system code defined by a Low Density Parity Check (LDPC) check matrix maintained by the LDPC check matrix maintaining unit 104 to be explained later. The code data is composed of data bits and parity bits.

In this embodiment, the code data is composed of four data bits $C_1$ to $C_4$ and four parity bits $C_5$ to $C_8$. Likelihoods $F_1$ to $F_8$ of the code data maintained by the input likelihood maintaining unit 101 correspond to the eight code data bits, respectively.

In other words, the input likelihood maintaining unit 101 maintains eight likelihoods $F_1$ to $F_8$ simultaneously. In addition, the input likelihood maintaining unit 101 outputs at least one of the maintained likelihoods to the anterior likelihood updating unit 105 and the parity check unit 107 in accordance with the processings in the anterior likelihood updating unit 105 and the parity check unit 107 at the subsequent stages.

The likelihood is a logarithm (base is a natural logarithm) of a comparison between probability P(x=0) at which the data bit is 0 and probability P(x=1) at which the data bit is 1. The likelihood is represented by the following formula (1). In the following descriptions, an anterior likelihood indicates a likelihood of an anterior probability and a posterior likelihood indicates likelihood of a posterior probability.

$$\log\left(\frac{P(x=0)}{P(x=1)}\right) \quad (1)$$

The sorting unit 102 sorts the likelihoods of the code data input from the signal processor of the preceding stage, on the basis of a predetermined standard. In this embodiment, the predetermined standard is an order of smaller absolute values of the input likelihoods $F_1$ to $F_8$. For this reason, the sorting unit 102 detects the absolute values of the input likelihoods $F_1$ to $F_8$, and sorts them in an order of smaller absolute values. The sorting unit 102 outputs information on index (hereinafter called index information) of the sorted input likelihoods $F_1$ to $F_8$ to the update schedule forming unit 103.

The update schedule forming unit 103 forms a column order (update schedule) of updating the anterior likelihood in the anterior likelihood updating unit 105, on the basis of the index information input from the sorting unit 102, and outputs the update schedule to the anterior likelihood updating unit 105. More specifically, the update schedule forming unit 103 forms an update schedule of updating the anterior likelihood from a column in which the absolute values of the input likelihoods $F_1$ to $F_8$ correspond to small bits on the basis of the index information.

Figure 2:
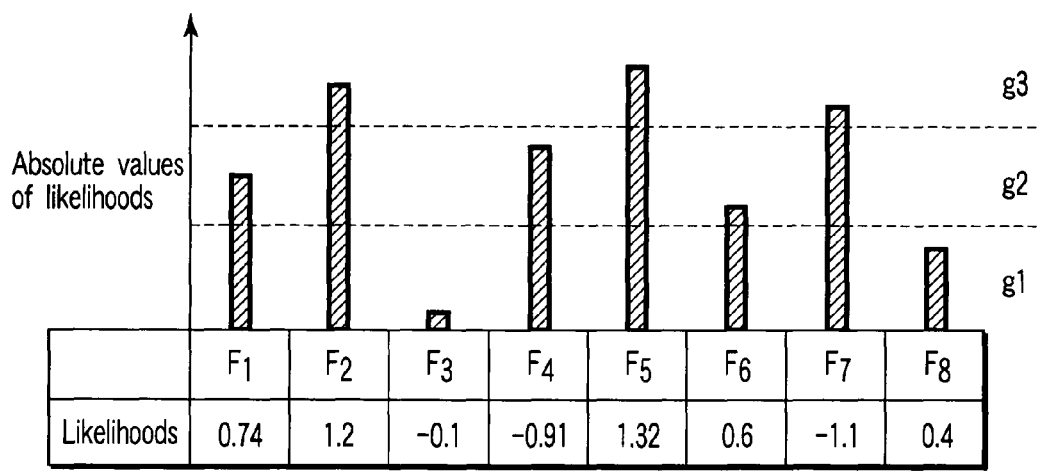
FIG. 2 is an illustration showing an example of input likelihood used in the decoder shown in FIG. 1.

This example is explained with reference to FIG. 2. FIG. 2 shows input likelihoods Fn (n=1 to 8) of the respective code data items $C_1$ to $C_8$. The input likelihoods Fn shown in this figure are sorted in an order of smaller absolute values by the sorting unit 102, such that the order is $|F_3|<|F_8|<|F_6|<|F_1|<|F_4|<|F_7|<|F_2|<|F_5|$.

Thus, the update schedule forming unit 103 inputs from the sorting unit 102 "$F_3 \to F_8 \to F_6 \to F_1 \to F_4 \to F_7 \to F_2 \to F_5$" as the information on indices I1 to I8 corresponding to the respective code data items $C_1$ to $C_8$ (input likelihoods $I_1$ to $I_8$). The update schedule forming unit 103 forms the update schedule on the basis of the index information.

The LDPC check matrix maintaining unit 104 preliminarily maintains information about an LDPC check matrix (hereinafter called check matrix) as shown in, for example, FIG. 3. The check matrix is preliminarily determined in cooperation with a sender side of the code data. The LDPC check matrix maintaining unit 104 outputs the information on the check matrix to the anterior likelihood updating unit 105 and the parity check unit 107 in response to necessity of each processing.

Figure 3:
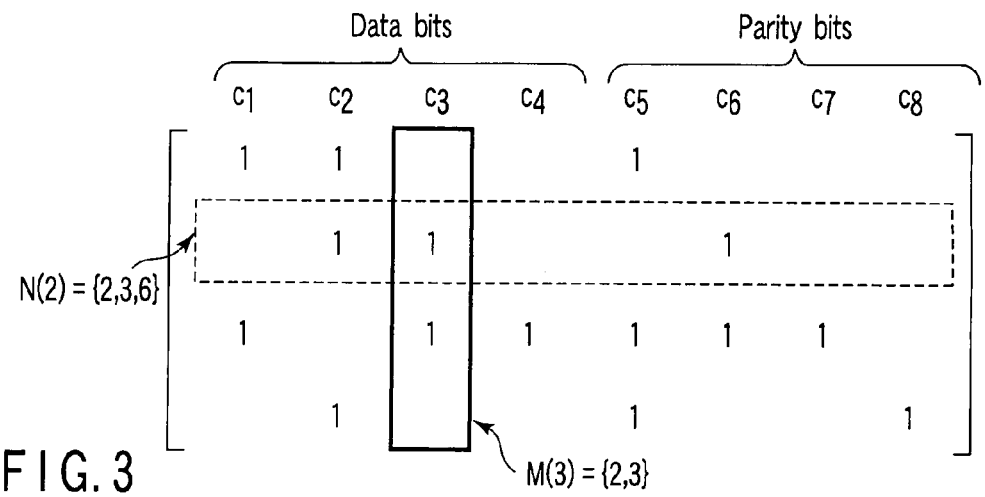
FIG. 3 is an illustration showing an example of LDPC check matrix used in the decoder shown in FIG. 1.

In FIG. 3, "0" is substituted in a location where there is not "1" in the check matrix. "1" in one row is called row weight and "1" in one column is called column weight. The code data defined by the check matrix of four rows and eight columns have code length of 8 and the parity length of 4. The column of the check matrix corresponds to each bit of the code data. The processing of all the columns is executed by the single decoding.

N(m) represents a set of column numbers of "1" in row m. As understood from FIG. 3, for example, N(2) is {2, 3, 6}. Similarly, for example, M(3) is {2, 3}. In the check matrix of the LDPC codes, the number of "1" in the rows is smaller than the size of the matrix. The circuit configuration of the LDPC check matrix maintaining unit 104 can be made smaller by maintaining the only location information on "1" used for the decoding.

The anterior likelihood updating unit 105 obtains new anterior likelihoods by using the input likelihoods $F_1$ to $F_8$ input from the input likelihood maintaining unit 101 and the anterior likelihood input from the anterior likelihood maintaining unit 106, in accordance with the information on the check matrix input from the LDPC check matrix maintaining unit 104 and the update schedule input from the update schedule forming unit 103. The anterior likelihood updating unit 105 outputs the new anterior likelihoods to the anterior likelihood maintaining unit 106. In addition, every time the anterior likelihood updating unit 105 obtains the new anterior likelihoods of all the columns, the anterior likelihood updating unit 105 discriminates that updating the anterior likelihoods is executed at one time, and notifies the parity check unit 107 of the updating.

Figure 4:
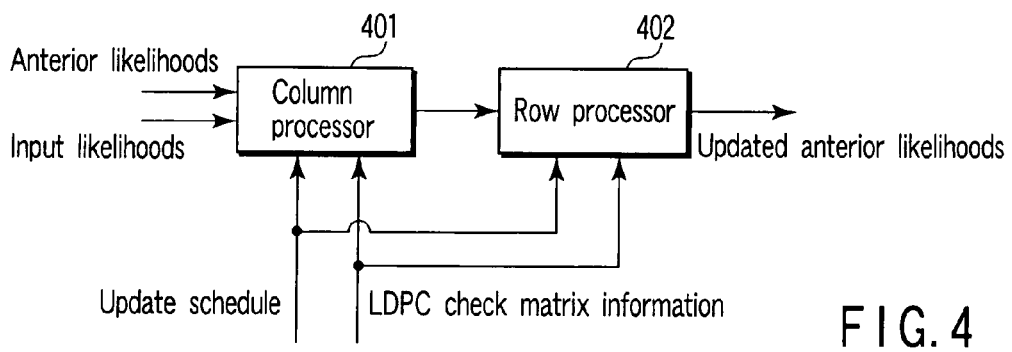
FIG. 4 is an illustration showing a configuration of an anterior likelihood updating unit of the decoder shown in FIG. 1.

FIG. 4 shows a configuration of the anterior likelihood updating unit 105. The anterior likelihood updating unit 105 comprises a column processor 401 and a row processor 402. The column processor 401 obtains a sub-posterior likelihood $z^{(i)}mn$ used in the row processor 402, from the following formula (2), on the basis of input likelihood Fn and anterior likelihood $r^{(i)}mn$.

$$z_{mn}^{(i)} = F_n + \sum_{m' \in M(n)\backslash m} r_{m'n}^{(i)} \quad (2)$$

In the formula (2), i represents the number of times of updating the anterior likelihood, n represents the column number of the check matrix, i.e. index of the code data bit, and m represents the row number of the check matrix. M(n) represents a set of row numbers at which there is "1" in row n as shown in FIG. 3. M(n)\m represents a subset of columns of the set M(n) excepting m. Thus, the sub-posterior likelihood $z^{(i)}mn$ represents the posterior likelihood of the code data bits excepting row m, of the n-th code data bits obtained after the i-th updating.

The row processor 402 obtains new anterior likelihood $r^{(i)}mn$ from the following formula (3) using the sub-posterior likelihood $z^{(i)}mn$ obtained in the above formula (2). In the initial decoding, since anterior likelihood $r^{(0)}mn=0$, the row processor 402 obtains anterior likelihood $r^{(1)}mn$ with the sub-posterior likelihood $z^{(0)}mn=Fn$. Np(m) represents a set of columns in which the i-th updating of the anterior likelihood has been conducted, of N(m). Nf(m) represents a set of columns in which the i-th updating of the anterior likelihood has not yet been conducted, which becomes N(m)\Np(m). The updating order of column n at this time depends on the update schedule input from the update schedule forming unit 103.

$$r_{mn}^{(i)} = 2\tanh^{-1}\left(\prod_{n' \in N_p(m)\backslash n} \tanh\frac{z_{mn'}^{(i)}}{2}\right) \times 2\tanh^{-1}\left(\prod_{n' \in N_f(m)\backslash n} \tanh\frac{z_{mn'}^{(i-1)}}{2}\right) \quad (3)$$

Figure 5:
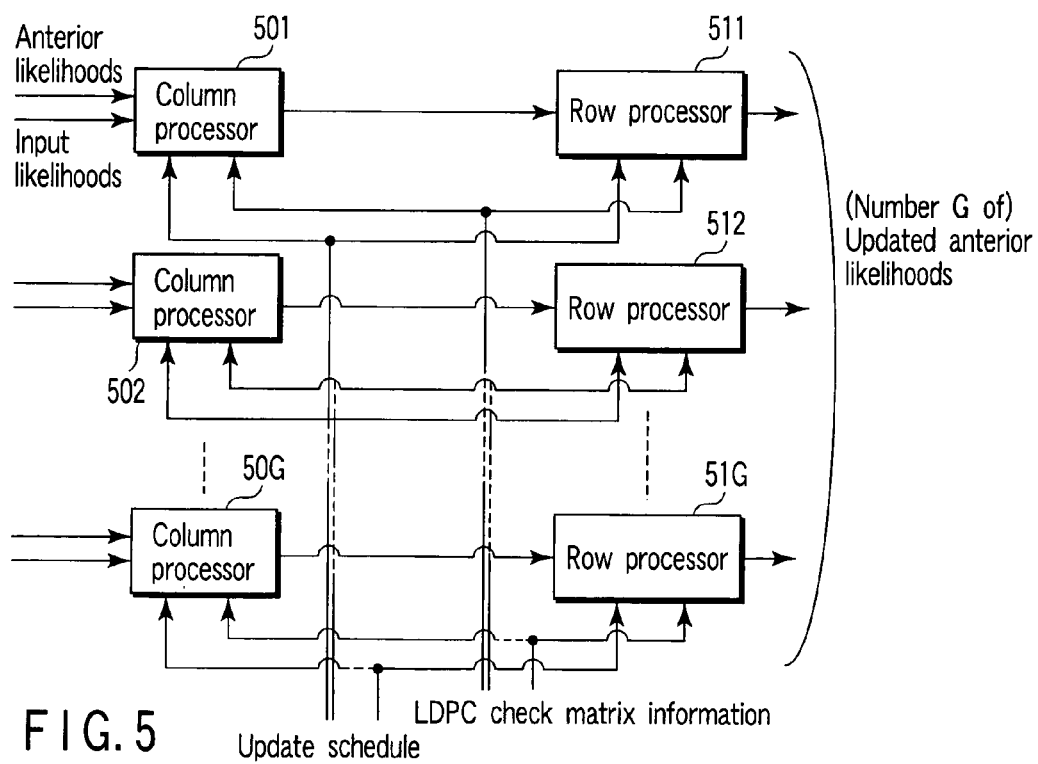
FIG. 5 is an illustration showing a configuration of the anterior likelihood updating unit of the decoder shown in FIG. 1.

In addition, FIG. 4 shows a configuration of the anterior likelihood updating unit 105 in a case where the anterior likelihood is updated in each column. If, instead of this, the anterior likelihood updating unit 105 comprises column processors 501 to 50G having the same function as the column processor 401 and row processors 511 to 51G having the same function as the row processor 402 as shown in FIG. 5, the anterior likelihood updating unit 105 can update a plurality of columns (number G of columns in FIG. 5) at one time.

The anterior likelihood maintaining unit 106 maintains the new anterior likelihoods input from the anterior likelihood updating unit 105. The number of anterior likelihoods maintained by the anterior likelihood maintaining unit 106 is equivalent to the number of 1 in the check matrix. The anterior likelihood maintaining unit 106 outputs the anterior likelihoods which the anterior likelihood maintaining unit 106 maintains to the parity check unit 107 when the parity check unit 107 conducts the parity check, or outputs the anterior likelihoods which the anterior likelihood maintaining unit 106 maintains to the anterior likelihood updating unit 105 when the anterior likelihood updating unit 105 updates the anterior likelihoods.

When the decoding is started, the anterior likelihood maintaining unit 106 maintains all the anterior likelihoods initialized at "0". If the new anterior likelihoods are input from the anterior likelihood updating unit 105, the anterior likelihood maintaining unit 106 deletes the previously maintained anterior likelihoods and maintains the new anterior likelihoods.

The parity check unit 107 calculates the posterior likelihoods on the basis of the input likelihoods $F_1$ to $F_8$ input from the input likelihood maintaining unit 101 and the anterior likelihoods input from the anterior likelihood maintaining unit 106, conducts hard decision based on the posterior likelihoods and obtains code data $C_1$ to $C_8$. The parity check unit 107 conducts parity check of the code data $C_1$ to $C_8$, on the basis of the information on the check matrix input from the LDPC check matrix maintaining unit 104.

If the result of the parity check is preferable or if the number of times of updating the anterior likelihoods notified by the anterior likelihood updating unit 105 reaches a preset number of times, the parity check unit 107 outputs the code data $C_1$ to $C_8$ (or anterior likelihoods of the code data $C_1$ to $C_8$) to a signal processor of a subsequent stage (not shown), to terminate the decoding of the code data $C_1$ to $C_8$. In the parity check unit 107, posterior likelihood $Z_n^{(i)}$ can be obtained in the following formula (4), on the basis of the input likelihood Fn and the anterior likelihood $Rmn^{(i)}$.

$$z_n^{(i)} = F_n + \sum_{m \in M(n)} r_{mn}^{(i)} \quad (4)$$

In the Formula (4), i represents number of times of iterating the decoding, and n represents the column number of the check matrix, i.e. the index of each of bits included in the code data $C_1$ to $C_8$. Therefore, posterior likelihood $Z^{(i)}n$ represents the posterior likelihood of n-th code data bit obtained after the i-th decoding. In addition, m represents the row number of the check matrix. M(n) represents a set of row numbers in which there is "1" in row n as shown in FIG. 3. In other words, the second item of the above formula (4) indicates the sum of anterior likelihoods calculated with the parity check scheme of the row in which there is "1" in the row n. The hard decision conducted in the parity check unit 107 is based on the positive or negative decision of the posterior likelihoods obtained in the above formula (4). The parity check unit 107 decides 0 when the posterior likelihood is positive or decides 1 when the posterior likelihood is negative.

Figure 6:
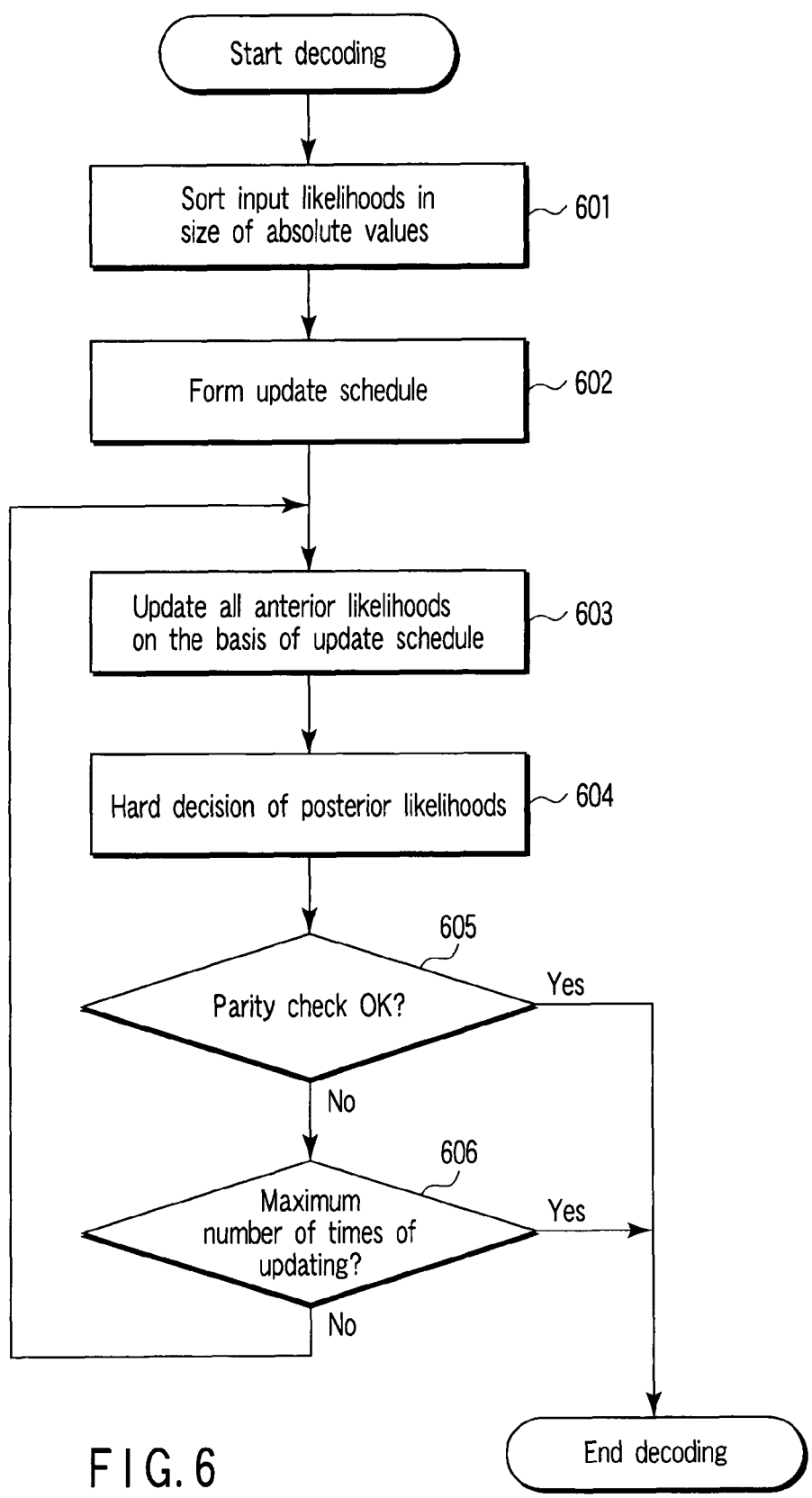
FIG. 6 is a flowchart showing operations of the decoder shown in FIG. 1.

Next, operations of the above-constructed decoder are explained. FIG. 6 shows a flowchart of the operations. The processing shown in this figure, from inputting the likelihoods $F_1$ to $F_8$ of the respective code data items $C_1$ to $C_8$ obtained by the signal processor (not shown) at the preceding stage, to outputting the code data items $C_1$ to $C_8$ based on the likelihoods $F_1$ to $F_8$, is considered as one cycle. When the code data items $C_1$ to $C_8$ (or the anterior likelihoods of the code data items $C_1$ to $C_8$) are output, processing of a new cycle is started.

First, when the processing is started, the likelihoods $F_1$ to $F_8$ of the respective code data items $C_1$ to $C_8$ are input to the input likelihood maintaining unit 101 and the sorting unit 102 by the signal processor of the preceding stage. The input likelihood maintaining unit 101 maintains the likelihoods $F_1$ to $F_8$ of the respective code data items $C_1$ to $C_8$ until decoding the likelihoods is completed.

In processing 601, the likelihoods $F_1$ to $F_8$ of the respective code data items $C_1$ to $C_8$ input to the sorting unit 102 are sorted in an order of smaller absolute values. The sorting unit 102 forms the index information indicating the order of the sorted likelihoods and outputs the index information to the update schedule forming unit 103.

In processing 602, the update schedule forming unit 103 forms a column order (update schedule) of updating the anterior likelihoods by the anterior likelihood updating unit 105, on the basis of the index information input from the sorting unit 102, and outputs the update schedule to the anterior likelihood updating unit 105.

In processing 603, the anterior likelihood updating unit 105 obtains the input likelihoods $F_1$ to $F_8$ from the input likelihood maintaining unit 101, obtains the information on the check matrix from the LDPC check matrix maintaining unit 104, and obtains the anterior likelihoods from the anterior likelihood maintaining unit 106. On the basis of the information on the check matrix and the update schedule input from the update schedule forming unit 103, the anterior likelihood updating unit 105 updates the anterior likelihoods of all the columns in the check matrix by using the input likelihoods $F_1$ to $F_8$ and the anterior likelihoods.

The anterior likelihoods thus updated are output to the anterior likelihood maintaining unit 106 and maintained in the anterior likelihood maintaining unit 106. The previous anterior likelihoods maintained in the anterior likelihood maintaining unit 106 are abandoned. When the anterior likelihood updating unit 105 requires the new anterior likelihoods, anterior likelihood updating unit 105 notifies the parity check unit 107 of the matter that updating the anterior likelihoods has been executed.

In processing 604, the parity check unit 107 receiving the notification obtains the latest anterior likelihoods maintained in the anterior likelihood maintaining unit 106 from the anterior likelihood maintaining unit 106, obtains the input likelihoods from the input likelihood maintaining unit 101, calculates the posterior likelihoods on the basis of the input likelihoods $F_1$ to $F_8$ and the anterior likelihoods, and executes hard decision based on the posterior likelihoods to obtain the code data items $C_1$ to $C_8$.

In processing 605, the parity check unit 107 obtains the information on the check matrix from the LDPC check matrix maintaining unit 104, and executes the parity check of the code data items $C_1$ to $C_8$ obtained in the processing 604. If the result of the parity check is preferable, the parity check unit 107 outputs the code data items $C_1$ to $C_8$ (or the anterior likelihoods of the code data items $C_1$ to $C_8$), and terminates the decoding of the code data items $C_1$ to $C_8$. On the other hand, if the result of the parity check is not preferable, the parity check unit 107 executes processing 606.

In processing 606, the parity check unit 107 discriminates whether or not number of times i of updating the anterior likelihoods notified in the processing 603 reaches a preset number of times. If the number of times i of updating the anterior likelihoods reaches the preset number of times, the parity check unit 107 outputs the code data items $C_1$ to $C_8$ (or the anterior likelihoods of the code data items $C_1$ to $C_8$) and terminates the decoding of the code data items $C_1$ to $C_8$. If the number of times i does not reach reaches the preset number of times, the parity check unit 107 executes the processing 603 again and updates the anterior likelihoods.

In the decoder having the above-described configuration, the schedule of updating the anterior likelihoods by using with priority the input likelihoods of a low reliability is formed on the basis of the absolute values of the input likelihoods $F_1$ to $F_8$, i.e. the magnitude of their reliability, and the anterior likelihoods are updated on the basis of the schedule.

Therefore, it is possible to prevent the input likelihoods of low reliability from being propagated at an initial stage of iteration by updating with priority the anterior likelihoods corresponding to the column having the input likelihoods of low reliability, and decoding can be executed at a small number of times of iteration. In addition, errors in the decoded data can be reduced.

In the above-described embodiment, the schedule of updating the anterior likelihoods by using with priority the input likelihoods of low reliability is formed without separating the data bits $C_1$ to $C_4$ and the parity bits $C_5$ to $C_8$, and the anterior likelihoods are updated in accordance with the schedule.

Instead of this, however, in relation to the columns corresponding to the parity bits $C_5$ to $C_8$, a schedule of updating the anterior likelihoods, with priority, about the columns corresponding to the input likelihoods of lower reliability, may be formed and the anterior likelihoods of the parity bits $C_5$ to $C_8$ may be updated on the basis of this schedule. Then, in relation to the columns corresponding to the parity bits $C_1$ to $C_4$, an update schedule of updating the anterior likelihoods, with priority, about the columns corresponding to the input likelihoods of lower reliability may be formed and the anterior likelihoods of the parity bits $C_1$ to $C_4$ may be updated on the basis of this schedule.

In the above-described decoding, since the anterior likelihoods are updated in order by the column unit, the updated anterior likelihoods of high reliability in the latter columns can be used. For this reason, if the anterior likelihoods relating to the columns corresponding to the parity bits $C_5$ to $C_8$ are updated and then the anterior likelihoods of $C_1$ to $C_4$ are updated, errors in the latter updated data bits $C_1$ to $C_4$ can be reduced.

For example, when the input likelihoods $F_1$ to $F_8$ are those shown in FIG. 2, they are sorted, by the sorting unit 102, in the order of smaller absolute values such as $|F_3|<|F_8|<|F_6|<|F_1|<|F_4|<|F_7|<|F_2|<|F_5|$. When the $C_5$ to $C_8$ are noted in this sequence, the likelihoods are $|F_8|<|F_6|<|F_7|<|F_5|$. When the $C_1$ to $C_4$ are noted in this sequence, the likelihoods are $|F_3|<|F_1|<|F_4|<|F_2|$. Therefore, the update schedule becomes $F_8 \rightarrow F_6 \rightarrow F_7 \rightarrow F_5 \rightarrow F_3 \rightarrow F_1 \rightarrow F_4 \rightarrow F_2$.

Figures 7, 8:
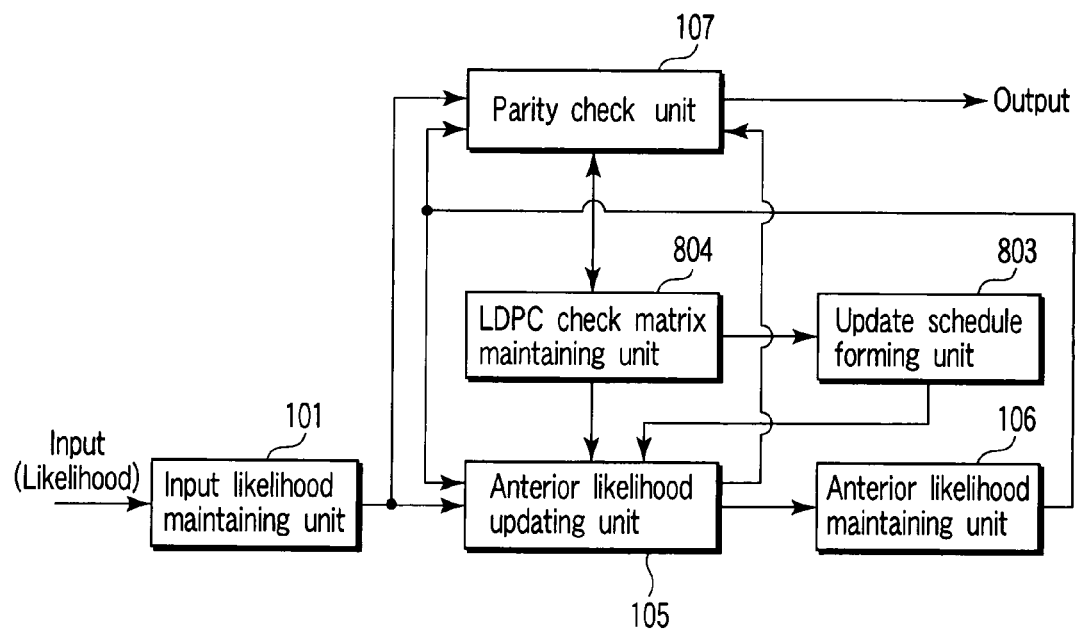
FIG. 7 is an illustration showing column weight of the LDPC check matrix shown in FIG. 3.
FIG. 8 is a block diagram showing a configuration of a decoder according to the second embodiment.

Next, a decoder according to a second embodiment of the present invention is described. FIG. 8 shows a configuration of the decoder, which comprises the input likelihood maintaining unit 101, an update schedule forming unit 803, an LDPC check matrix maintaining unit 804, the anterior likelihood updating unit 105, the anterior likelihood maintaining unit 106 and the parity check unit 107.

Elements shown in FIG. 8 having like, or similar functions to those shown in FIG. 1 are denoted by similar reference numbers and are not described in detail here, and different constituent elements are focused. In addition, a configuration concerning the decoding alone is described in the following descriptions, but the decoder also comprises a configuration of an encoder which executes encoding.

The characteristic of the decoder shown in FIG. 8 is to form an update schedule on the basis of the structure of the LDPC check matrix while the update schedule is formed on the basis of the values of the input likelihoods $F_1$ to $F_8$ in the decoder of the first embodiment.

Similarly to the LDPC check matrix maintaining unit 104, the LDPC check matrix maintaining unit 804 preliminarily maintains the information on the LDPC check matrix (hereinafter called check matrix) as shown in, for example, FIG. 3. The check matrix is preliminarily determined in cooperation with a sender side of the code data. The LDPC check matrix maintaining unit 804 outputs the information on the check matrix to the anterior likelihood updating unit 105, the parity check unit 107 and the update schedule forming unit 803 in response to necessity of each processing.

The update schedule forming unit 803 detects a structure of the check matrix from the information on the check matrix input from the LDPC check matrix maintaining unit 804, forms the update schedule suitable for the check matrix on the basis of the detection result, and outputs the update schedule to the anterior likelihood updating unit 105.

In a case of the check matrix shown in, for example, FIG. 7 in which the column weight is different in each column, a more correct anterior likelihood can be obtained in the column having a greater column weight. The column weight is the number "1" of the column. For this reason, the update schedule forming unit 803 detects the weights of the respective columns in the check matrix and forms the update schedule on the basis of the detection result.

In the case of the check matrix shown in FIG. 7, the update schedule forming unit 803 forms the update schedule for updating with priority the anterior likelihoods of the columns having greater column weights, similarly to $I_2 \rightarrow I_5 \rightarrow I_1 \rightarrow I_3 \rightarrow I_6 \rightarrow I_4 \rightarrow I_7 \rightarrow I_8$. Thus, it is possible to prevent propagation of the likelihood of a low reliability and conduct decoding with a good efficiency.

Thus, formation of the update schedule depends only on the structure of the check matrix in the decoder of the second embodiment, unlike the decoder of the first embodiment. For this reason, in a system in which the check matrix is not dynamically changed, the update schedule can be formed preliminarily. Therefore, the update schedule does not need to be formed for each of the code data items C1 to C8, unlike the decoder of the first embodiment.

The anterior likelihood updating unit 105 obtains new anterior likelihoods of all the columns by using the likelihoods $F_1$ to $F_8$ of the code data input from the input likelihood maintaining unit 101 and the anterior likelihood input from the anterior likelihood maintaining unit 106, in accordance with the information on the check matrix input from the LDPC check matrix maintaining unit 804 and the update schedule input from the update schedule forming unit 803. The anterior likelihood updating unit 105 outputs the new anterior likelihoods to the anterior likelihood maintaining unit 106. In addition, every time the anterior likelihood updating unit 105 obtains the new anterior likelihoods, the anterior likelihood updating unit 105 discriminates that updating the anterior likelihoods is executed at one time, and notifies the parity check unit 107 of the updating.

The anterior likelihood maintaining unit 106 maintains the new anterior likelihoods input from the anterior likelihood updating unit 105. The number of anterior likelihoods maintained by the anterior likelihood maintaining unit 106 is equivalent to the number of 1 in the check matrix. The anterior likelihood maintaining unit 106 outputs the anterior likelihoods which the anterior likelihood maintaining unit 106 maintains to the parity check unit 107 when the parity check unit 107 conducts the parity check, or outputs the anterior likelihoods which the anterior likelihood maintaining unit 106 maintains to the anterior likelihood updating unit 105 when the anterior likelihood updating unit 105 updates the anterior likelihoods.

When the decoding is started, the anterior likelihood maintaining unit 106 maintains all the anterior likelihoods initialized at "0". If the new anterior likelihoods are input from the anterior likelihood updating unit 105, the anterior likelihood maintaining unit 106 deletes the previously maintained anterior likelihoods and maintains the new anterior likelihoods.

The parity check unit 107 calculates the posterior likelihoods on the basis of the input likelihoods $F_1$ to $F_8$ input from the input likelihood maintaining unit 101 and the anterior likelihoods input from the anterior likelihood maintaining unit 106, conducts hard decision based on the posterior likelihoods and obtains code data $C_1$ to $C_8$. The parity check unit 107 conducts parity check of the code data $C_1$ to $C_8$, on the basis of the information on the check matrix input from the LDPC check matrix maintaining unit 804.

If the result of the parity check is preferable or if the number of times of updating the anterior likelihoods notified by the anterior likelihood updating unit 105 reaches a preset number of times, the parity check unit 107 outputs the code data $C_1$ to $C_8$ (or anterior likelihoods of the code data $C_1$ to $C_8$) to a signal processor of a subsequent stage (not shown), to terminate the decoding of the code data $C_1$ to $C_8$.

Figure 9:
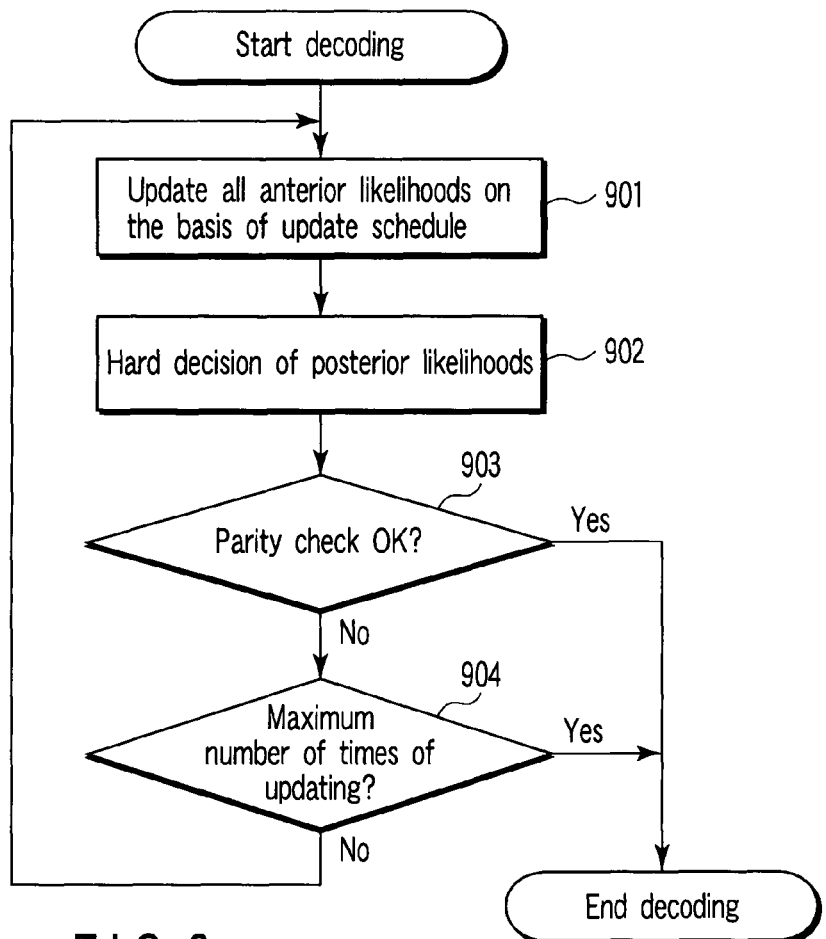
FIG. 9 is a flowchart showing operations of the decoder shown in FIG. 8.

Next, operations of the above-constructed decoder are explained. FIG. 9 shows a flowchart of the operations. The processing shown in this figure, from inputting the likelihoods $F_1$ to $F_8$ of the respective code data items $C_1$ to $C_8$ obtained by the signal processor (not shown) at the preceding stage, to outputting the code data items $C_1$ to $C_8$ based on the likelihoods $F_1$ to $F_8$, is considered as one cycle. When the code data items $C_1$ to $C_8$ (or the anterior likelihoods of the code data items $C_1$ to $C_8$) are output, processing of a new cycle is started.

First, when the processing is started, the likelihoods $F_1$ to $F_8$ of the respective code data items $C_1$ to $C_8$ are input to the input likelihood maintaining unit 101 by the signal processor of the preceding stage. The input likelihood maintaining unit 101 maintains the likelihoods $F_1$ to $F_8$ of the respective code data items $C_1$ to $C_8$ until decoding the likelihoods is completed. At this time, the update schedule forming unit 803 has formed the update schedule suitable for the check matrix on the basis of the information on the check matrix input from the LDPC check matrix maintaining unit 804, and has output the update schedule to the anterior likelihood updating unit 105.

In processing 901, the anterior likelihood updating unit 105 obtains the input likelihoods $F_1$ to $F_8$ from the input likelihood maintaining unit 101, obtains the information on the check matrix from the LDPC check matrix maintaining unit 804, and obtains the anterior likelihoods from the anterior likelihood maintaining unit 106. On the basis of the information on the check matrix and the update schedule input from the update schedule forming unit 803, the anterior likelihood updating unit 105 updates the anterior likelihoods of all the columns in the check matrix by using the input likelihoods $F_1$ to $F_8$ and the anterior likelihoods.

The anterior likelihoods thus updated are output to the anterior likelihood maintaining unit 106 and maintained in the anterior likelihood maintaining unit 106. The previous anterior likelihoods maintained in the anterior likelihood maintaining unit 106 are abandoned. When the anterior likelihood updating unit 105 requires the new anterior likelihoods, anterior likelihood updating unit 105 notifies the parity check unit 107 of the matter that updating the anterior likelihoods has been executed.

In processing 902, the parity check unit 107 receiving the notification obtains the latest anterior likelihoods maintained in the anterior likelihood maintaining unit 106 from the anterior likelihood maintaining unit 106, obtains the input likelihoods $F_1$ to $F_8$ from the input likelihood maintaining unit 101, calculates the posterior likelihoods on the basis of the input likelihoods $F_1$ to $F_8$ and the anterior likelihoods, and executes hard decision based on the posterior likelihoods to obtain the code data items $C_1$ to $C_8$.

In processing 903, the parity check unit 107 obtains the information on the check matrix from the LDPC check matrix maintaining unit 104, and executes the parity check of the code data items $C_1$ to $C_8$ obtained in the processing 902. If the result of the parity check is preferable, the parity check unit 107 outputs the code data items $C_1$ to $C_8$ (or the anterior likelihoods of the code data items $C_1$ to $C_8$), and terminates the decoding of the code data items $C_1$ to $C_8$. On the other hand, if the result of the parity check is not preferable, the parity check unit 107 executes processing 904.

In processing 904, the parity check unit 107 discriminates whether or not number of times i of updating the anterior likelihoods notified in the processing 901 reaches a preset number of times. If the number of times i of updating the anterior likelihoods reaches the preset number of times, the parity check unit 107 outputs the code data items $C_1$ to $C_8$ (or the anterior likelihoods of the code data items $C_1$ to $C_8$) and terminates the decoding of the code data items $C_1$ to $C_8$. If the number of times i does not reach reaches the preset number of times, the parity check unit 107 executes the processing 901 again and updates the anterior likelihoods.

In the decoder having the above-described configuration, the schedule of updating the anterior likelihoods by using with priority the input likelihoods corresponding to the columns in which the column weights are heavy, is formed on the basis of the structure of the LDPC check matrix, and the anterior likelihoods are updated on the basis of the schedule.

Therefore, since the columns from which the anterior likelihoods of high reliability can be obtained and in which the column weights are heavy are updated with priority, the anterior likelihoods can be updated with the anterior likelihoods of high reliability in the columns to be updated at the subsequent stage, and decoding can be carried out at a small number of times of iteration. In addition, errors in the decoded data can be reduced.

In the above-described embodiment, the schedule of updating the anterior likelihoods by using with priority the input likelihoods corresponding to the columns having great column weights is formed without separating the data bits $C_1$ to $C_4$ and the parity bits $C_5$ to $C_8$, and the anterior likelihoods are updated in accordance with the schedule.

Instead of this, however, in relation to the columns corresponding to the parity bits $C_5$ to $C_8$, a schedule of updating the anterior likelihoods by using with priority the input likelihoods corresponding to the order of the columns having greater column weights, may be formed and the anterior likelihoods of the parity bits $C_5$ to $C_8$ may be updated on the basis of this schedule. Then, in relation to the columns corresponding to the parity bits $C_1$ to $C_4$, an update schedule of updating with priority the anterior likelihoods in the columns of grater column weights may be formed and the anterior likelihoods of the parity bits $C_1$ to $C_4$ may be updated on the basis of this schedule.

In the above decoding of updating the anterior likelihoods in order by the column unit, the updated anterior likelihoods of high reliability can be used in the latter columns. In the LDPC check matrix shown in FIG. 7, for example, errors in the data bits $C_1$ to $C_4$ can be reduced by forming an update schedule such as $I_5 \rightarrow I_6 \rightarrow I_7 \rightarrow I_8 \rightarrow I_2 \rightarrow I_1 \rightarrow I_3 \rightarrow I_4$.

Figure 10:
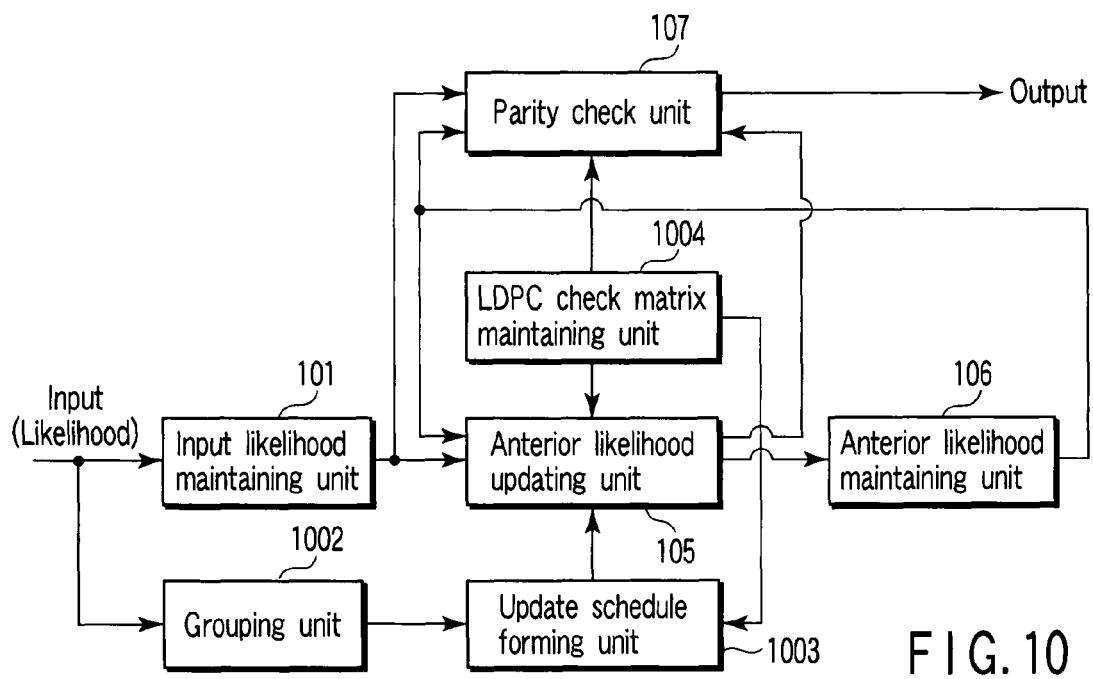
FIG. 10 is a block diagram showing a configuration of a decoder according to the third embodiment.

Next, a decoder according to a third embodiment of the present invention is described. FIG. 10 shows a configuration of the decoder, which comprises the input likelihood maintaining unit 101, a grouping unit 1002, an update schedule forming unit 1003, an LDPC check matrix maintaining unit 1004, the anterior likelihood updating unit 105, the anterior likelihood maintaining unit 106 and the parity check unit 107.

Elements shown in FIG. 10 having like or similar functions to those shown in FIG. 1 are denoted by similar reference numbers and are not described in detail here, and different constituent elements are focused. In addition, a configuration concerning the decoding alone is described in the following descriptions, but the decoder also comprises a configuration of an encoder which executes encoding.

The characteristic of the decoder shown in FIG. 10 is to form an update schedule on the basis of the input likelihood values and the structure of the LDPC check matrix, by considering both the method of forming the update schedule in the decoder of the first embodiment and the method of forming the update schedule in the decoder of the second embodiment.

The grouping unit 1002 detects a magnitude of absolute values of the likelihoods $F_1$ to $F_8$ of the respective code data items $C_1$ to $C_8$ input from the signal processor of the preceding stage. Then, the grouping unit 1002 separates the likelihoods into at least two groups and outputs a group index indicating the groups to which the likelihoods $F_1$ to $F_8$ belong to the update schedule forming unit 1003.

For example, if the likelihoods $F_1$ to $F_8$ of the respective code data items $C_1$ to $C_8$ defined in the check matrix shown in FIG. 7 are those shown in FIG. 2, the grouping unit 1002 compares the magnitude of the absolute values of the respective likelihoods with threshold values, and separates the likelihoods $F_1$ to $F_8$ into three groups g1, g2, g3. In the example shown in FIG. 2, the threshold values are "0.5" and "1.0". The number of threshold values and groups is arbitrarily set by experiments.

Similarly to the LDPC check matrix maintaining unit 104, the LDPC check matrix maintaining unit 1004 preliminarily maintains the information on the LDPC check matrix (hereinafter called check matrix) as shown in, for example, FIG. 3. The check matrix is preliminarily determined in cooperation with a sender side of the code data. The LDPC check matrix maintaining unit 1004 outputs the information on the check matrix to the anterior likelihood updating unit 105, the parity check unit 107 and the update schedule forming unit 1003 in response to necessity of each processing.

The update schedule forming unit 1003 detects a structure of the check matrix from the information on the check matrix input from the LDPC check matrix maintaining unit 1004, and forms an update schedule indicating in which column the anterior likelihood should be updated, on the basis of the detection result and information of the group index obtained from the grouping unit 1002.

In the check matrix shown in, for example, FIG. 7, since the column weights are different in columns, a more correct anterior likelihood can be obtained in the column having a greater column weight. For this reason, the update schedule forming unit 1003 forms the update schedule of updating with priority the anterior likelihoods of the columns corresponding to the likelihoods included in the group in which the absolute values of the input likelihoods F1 to F8 are small. If there are a plurality of likelihoods for the same group, the update schedule forming unit 1003 forms an update schedule for updating with priority the anterior likelihoods of columns having greater column weights, on the basis of the detection result. The update schedule forming unit 1003 may form an update schedule of updating the likelihoods in order of their magnitude in each group after grouping by column weight.

In other words, if the input likelihoods $F_1$ to $F_8$ of the respective code data items $C_1$ to $C_8$ defined in the check matrix of FIG. 7 are those shown in FIG. 2, the update schedule forming unit 1003 forms an update schedule of: $I_3$ (g1)$\rightarrow I_8$ (g1)$\rightarrow I_1$ (g2)$\rightarrow I_4$ (g2)$\rightarrow I_6$ (g2)$\rightarrow I_2$ (g3)$\rightarrow I_5$ (g3)$\rightarrow I_7$ (g3).

The anterior likelihood updating unit 105 obtains new anterior likelihoods of all the columns by using the likelihoods $F_1$ to $F_8$ of the code data input from the input likelihood maintaining unit 101 and the anterior likelihood input from the anterior likelihood maintaining unit 106, in accordance with the information on the check matrix input from the LDPC check matrix maintaining unit 1004 and the update schedule input from the update schedule forming unit 1003. The anterior likelihood updating unit 105 outputs the new anterior likelihoods to the anterior likelihood maintaining unit 106. In addition, every time the anterior likelihood updating unit 105 obtains the new anterior likelihoods, the anterior likelihood updating unit 105 discriminates that updating the anterior likelihoods is executed at one time, and notifies the parity check unit 107 of the updating.

The anterior likelihood maintaining unit 106 maintains the new anterior likelihoods input from the anterior likelihood updating unit 105. The number of anterior likelihoods maintained by the anterior likelihood maintaining unit 106 is equivalent to the number of 1 in the check matrix. The anterior likelihood maintaining unit 106 outputs the anterior likelihoods which the anterior likelihood maintaining unit 106 maintains to the parity check unit 107 when the parity check unit 107 conducts the parity check, or outputs the anterior likelihoods which the anterior likelihood maintaining unit 106 maintains to the anterior likelihood updating unit 105 when the anterior likelihood updating unit 105 updates the anterior likelihoods.

When the decoding is started, the anterior likelihood maintaining unit 106 maintains all the anterior likelihoods initialized at "0". If the new anterior likelihoods are input from the anterior likelihood updating unit 105, the anterior likelihood maintaining unit 106 deletes the previously maintained anterior likelihoods and maintains the new anterior likelihoods.

The parity check unit 107 calculates the posterior likelihoods on the basis of the input likelihoods $F_1$ to $F_8$ input from the input likelihood maintaining unit 101 and the anterior likelihoods input from the anterior likelihood maintaining unit 106, conducts hard decision based on the posterior likelihoods and obtains code data $C_1$ to $C_8$. The parity check unit 107 conducts parity check of the code data $C_1$ to $C_8$, on the basis of the information on the check matrix input from the LDPC check matrix maintaining unit 1004.

If the result of the parity check is preferable or if the number of times of updating the anterior likelihoods notified by the anterior likelihood updating unit 105 reaches a preset number of times, the parity check unit 107 outputs the code data $C_1$ to $C_8$ (or anterior likelihoods of the code data $C_1$ to $C_8$) to a signal processor of a subsequent stage (not shown), to terminate the decoding of the code data $C_1$ to $C_8$.

Figure 11:
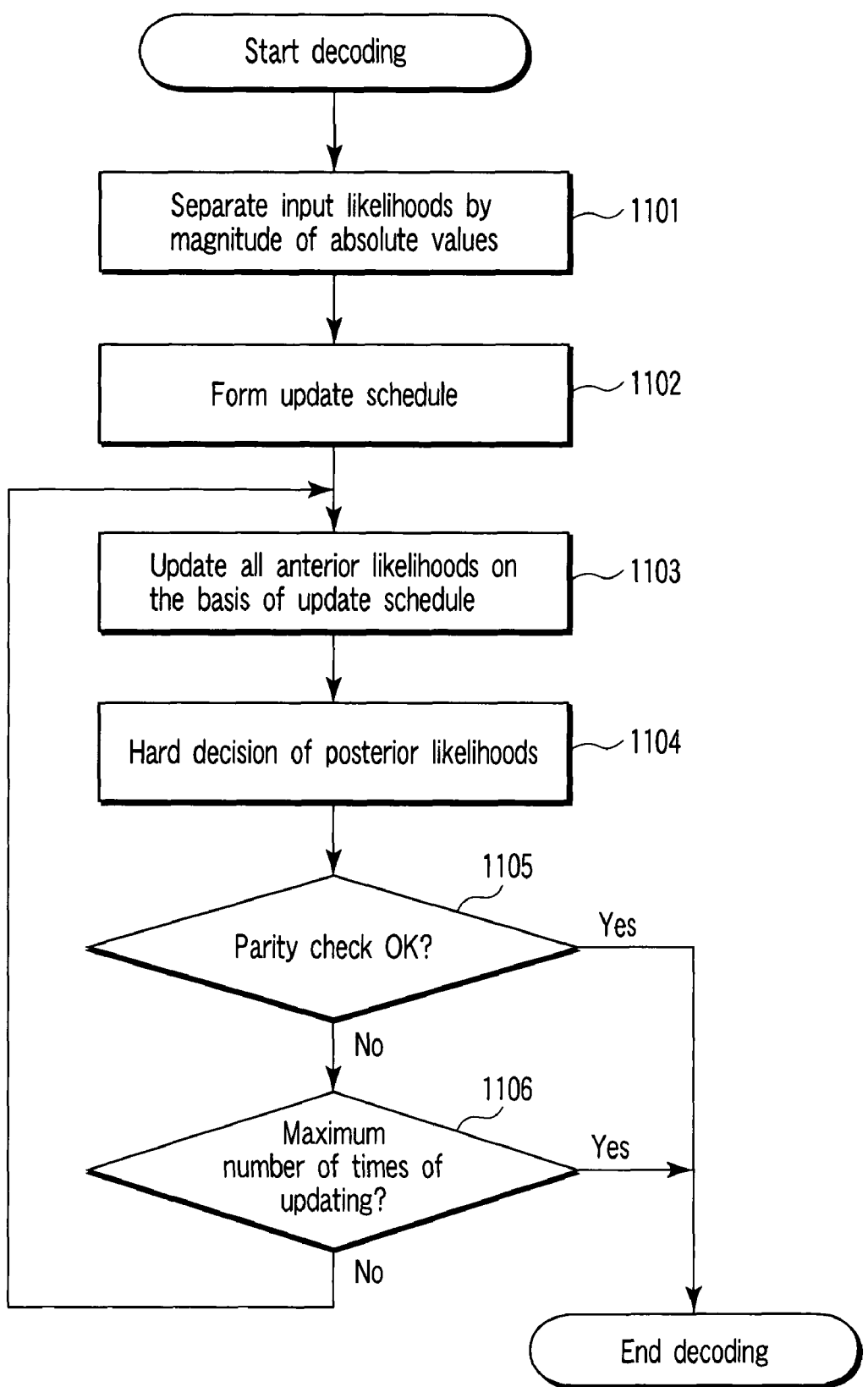
FIG. 11 is a flowchart showing operations of the decoder shown in FIG. 10.

Next, operations of the above-constructed decoder are explained. FIG. 11 shows a flowchart of the operations. The processing shown in this figure, from inputting the likelihoods $F_1$ to $F_8$ of the respective code data items $C_1$ to $C_8$ obtained by the signal processor (not shown) at the preceding stage, to outputting the code data items $C_1$ to $C_8$ based on the likelihoods $F_1$ to $F_8$, is considered as one cycle. When the code data items $C_1$ to $C_8$ (or the anterior likelihoods of the code data items $C_1$ to $C_8$) are output, processing of a new cycle is started.

First, when the processing is started, the likelihoods $F_1$ to $F_8$ of the respective code data items $C_1$ to $C_8$ are input to the input likelihood maintaining unit 101 and the grouping unit 1002 by the signal processor of the preceding stage. The input likelihood maintaining unit 101 maintains the likelihoods $F_1$ to $F_8$ of the respective code data items $C_1$ to $C_8$ until decoding the likelihoods is completed.

In processing 1101, the likelihoods $F_1$ to $F_8$ of the respective code data items $C_1$ to $C_8$ input to the grouping unit 1002 are sorted in the order of smaller absolute values. The grouping unit 1002 forms the index information indicating the order of the sorted likelihoods and outputs the index information to the update schedule forming unit 1003.

In processing 1102, the update schedule forming unit 1903 detects the structure of the check matrix from the information on the check matrix input from the LDPC check matrix maintaining unit 1004 and forms an update schedule indicating the column in which the anterior likelihoods should be first updated, on the basis of the information on the group index obtained from the grouping unit 1002. The update schedule is output to the anterior likelihood updating unit 105.

In processing 1103, the anterior likelihood updating unit 105 obtains the input likelihoods $F_1$ to $F_8$ from the input likelihood maintaining unit 101, obtains the information on the check matrix from the LDPC check matrix maintaining unit 1004, and obtains the anterior likelihoods from the anterior likelihood maintaining unit 106. On the basis of the information on the check matrix and the update schedule input from the update schedule forming unit 1003, the anterior likelihood updating unit 105 updates the anterior likelihoods of all the columns in the check matrix by using the input likelihoods $F_1$ to $F_8$ and the anterior likelihoods.

The anterior likelihoods thus updated are output to the anterior likelihood maintaining unit 106 and maintained in the anterior likelihood maintaining unit 106. The previous anterior likelihoods maintained in the anterior likelihood maintaining unit 106 are abandoned. When the anterior likelihood updating unit 105 requires the new anterior likelihoods, anterior likelihood updating unit 105 notifies the parity check unit 107 of the matter that updating the anterior likelihoods has been executed.

In processing 1104, the parity check unit 107 receiving the notification obtains the latest anterior likelihoods maintained in the anterior likelihood maintaining unit 106 from the anterior likelihood maintaining unit 106, obtains the input likelihoods $F_1$ to $F_8$ from the input likelihood maintaining unit 101, calculates the posterior likelihoods on the basis of the input likelihoods $F_1$ to $F_8$ and the anterior likelihoods, and executes hard decision based on the posterior likelihoods to obtain the code data items.

In processing 1105, the parity check unit 107 obtains the information on the check matrix from the LDPC check matrix maintaining unit 1004, and executes the parity check of the code data items $C_1$ to $C_8$ obtained in the processing 1104. If the result of the parity check is preferable, the parity check unit 107 outputs the code data items $C_1$ to $C_8$ (or the anterior likelihoods of the code data items $C_1$ to $C_8$), and terminates the decoding of the code data items $C_1$ to $C_8$. On the other hand, if the result of the parity check is not preferable, the parity check unit 107 executes processing 1106.

In processing 1106, the parity check unit 107 discriminates whether or not number of times i of updating the anterior likelihoods notified in the processing 1103 reaches a preset number of times. If the number of times i of updating the anterior likelihoods reaches the preset number of times, the parity check unit 107 outputs the code data items $C_1$ to $C_8$ (or the anterior likelihoods of the code data items $C_1$ to $C_8$) and terminates the decoding of the code data items $C_1$ to $C_8$. If the number of times i does not reach reaches the preset number of times, the parity check unit 107 executes the processing 1103 again and updates the anterior likelihoods.

In the decoder having the above-described configuration, the schedule of updating the anterior likelihoods by using with priority the input likelihoods corresponding to the columns in which the reliability is low and the column weights are heavy, is formed on the basis of the structure of the LDPC check matrix, and the anterior likelihoods are updated on the basis of the schedule.

Therefore, since the anterior likelihoods of the columns from which the anterior likelihoods of high reliability can be obtained and in which the column weights are heavy, of the column having the input likelihoods of low reliability, are updated with priority, propagation of the likelihoods of low reliability can be prevented at the initial stage of the iterating processing, and decoding can be carried out at a small number of times of iteration. In addition, errors in the decoded data can be reduced.

In the above-described embodiment, the schedule of updating the anterior likelihoods by using with priority the input likelihoods corresponding to the columns having great column weights is formed without separating the data bits $C_1$ to $C_4$ and the parity bits $C_5$ to $C_8$, and the anterior likelihoods are updated in accordance with the schedule.

Instead of this, however, in relation to the columns corresponding to the parity bits $C_5$ to $C_8$, a schedule of updating the anterior likelihoods by using with priority the input likelihoods corresponding to the order of the columns having greater column weights, may be formed and the anterior likelihoods of the parity bits $C_5$ to $C_8$ may be updated on the basis of this schedule. Then, in relation to the columns corresponding to the data bits $C_1$ to $C_4$, an update schedule of updating with priority the anterior likelihoods in the columns of grater column weights may be formed and the anterior likelihoods of the data bits $C_1$ to $C_4$ may be updated on the basis of this schedule.

In the above decoding, since the anterior likelihoods are updated in order by the column unit, the updated anterior likelihoods of high reliability can be used in the latter columns. For this reason, if the anterior likelihoods of the data bits $C_1$ to $C_4$ are updated after updating of the anterior likelihoods in the columns corresponding to the parity bits $C_5$ to $C_8$, errors in the data bits $C_1$ to $C_4$ updated in the latter processing can be reduced.

For example, in a case where the input likelihoods $F_1$ to $F_4$ are those shown in FIG. 2, since the threshold values are "0.5" and "1.0", the grouping unit 1002 separates $I_3$ and $I_8$ as group g1, $I_1$, $I_4$ and $I_6$ as group g2, and $I_2$, $I_5$ and $I_7$ as group g3, and a group index indicating these groups is output to the update schedule forming unit 1003.

However, the update schedule forming unit 1003 separates the data bits $C_1$ to $C_4$ and forms an update schedule for updating with priority the anterior likelihoods of the columns corresponding to the parity bits $C_5$ to $C_8$ and then updating with priority the anterior likelihoods of the columns corresponding to the data bits $C_1$ to $C_4$. In other words, in the example shown in FIG. 2, the update schedule becomes $I_8 \rightarrow I_6 \rightarrow I_5 \rightarrow I_7 \rightarrow I_3 \rightarrow I_1 \rightarrow I_4 \rightarrow I_2$.

Figure 12:
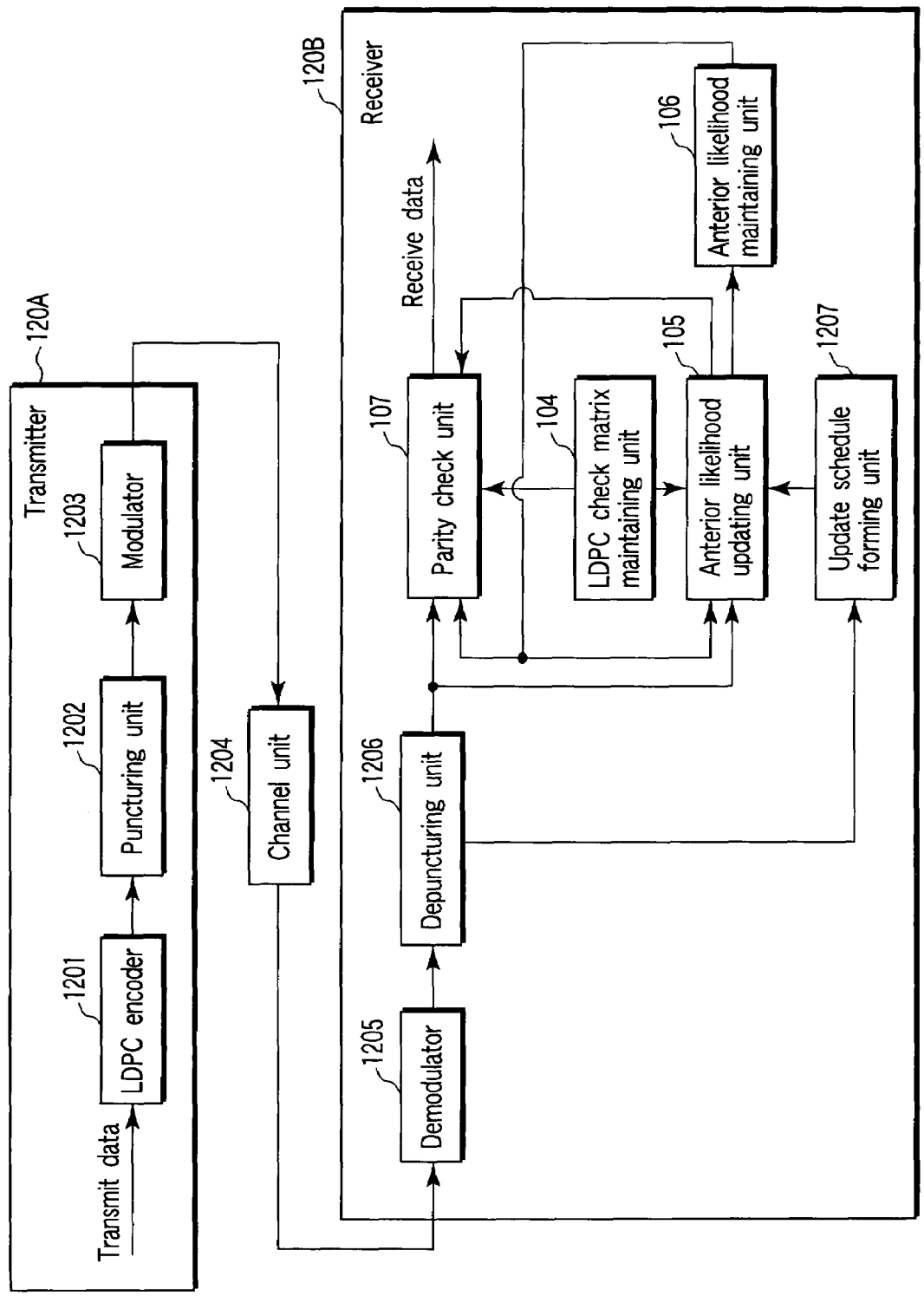
FIG. 12 is a block diagram showing a configuration of a communication system according to the fourth embodiment.

Next, a communication system according to a fourth embodiment of the present invention is described. The decoder of the present invention is applied to the communication system. FIG. 12 shows a configuration of the decoder, which comprises a transmitter 120A and a receiver 120B. In this communication system, the transmitter 120A encodes the transmit data with LDPC codes and transmits the encoded transmit data. The receiver 120B receives and decodes the transmit data received through a channel unit 1204 peculiar to the communication system, and obtains receive data.

The transmitter 120A comprises an LDPC encoder 1201, a puncturing unit 1202, and a modulator 1203.

The LDPC encoder 1201 generates code data $C_1$ to $C_8$ by encoding the transmit data with the LDPC codes, and outputs the code data to the puncturing unit 1202.

Figures 13, 14:
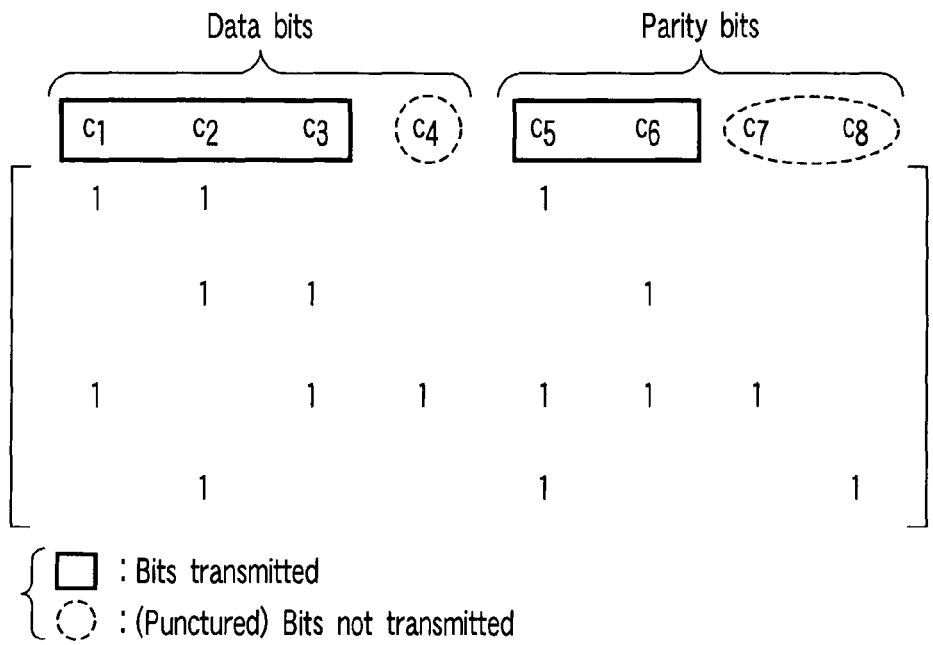
FIG. 13 is an illustration showing puncture executed in the communication system shown in FIG. 12.
FIG. 14 is a table showing likelihoods input to and output from a de-puncture unit shown in FIG. 12.

The puncturing unit 1202 punctures the code data $C_1$ to $C_8$ input from the LDPC encoder 1201 in order to achieve an arbitrary encoding rate. In other words, the puncturing unit 1202 reduces the code data $C_1$ to $C_8$ by at least one bit. Then, the puncturing unit 1202 outputs the punctured code data to the modulator 1203. An example of puncturing is shown in FIG. 13. As shown in FIG. 13, the coding rate of the code data $C_1$ to $C_8$ can be changed from 0.5 to 0.8 by puncturing, for example, the code data $C_4$, $C_7$, and $C_8$.

The modulator 1203 modulates a carrier wave with the punctured code data input from the puncturing unit 1202, converts the carrier wave into a signal suitable for transmission via the channel unit 1204, and outputs the converted signal to a transmission path.

By the channel unit 1204 in the transmission path, distortion peculiar to the communication system such as Gauss heat noise, multipath fading, etc. is added to the signal output to the transmission path, and the signal is transmitted to the receiver 120B.

The receiver 120B comprises a demodulator 1205, a depuncturing unit 1206, an update schedule forming unit 1207, the LDPC check matrix maintaining unit 104, an anterior likelihood updating unit 105, an anterior likelihood maintaining unit 106 and a parity check unit 107.

Elements of the receiver 120B shown in FIG. 12 having like or similar functions to those shown in FIG. 1 are denoted by similar reference numbers and are not described in detail here, and different constituent elements are focused. In addition, the only constitution concerning the decoding in the receiver 120B is described in the following descriptions, but the receiver 120B also comprises a configuration of an encoder which executes encoding.

The demodulator 1205 receives and demodulates a signal output from the modulator 1203 via the channel unit 1204, obtains likelihoods of the respective punctured code data items by calculating the likelihoods of the respective bits from the demodulated receive signal and outputs the obtained likelihoods to the depuncturing unit 1206. If an erasure error which causes a bit to be erased occurs, the demodulator 1205 compensates the likelihood of the deleted bit for the same value (for example, 0) as the likelihood of the puncture bit to be explained later, and outputs the likelihood to the depuncturing unit 1206. In the processing of the subsequent stage, since the bit interpolated due to the erasure is handled in the same manner as the puncture bit in the formation of the schedule, the demodulator 1205 notifies the depuncturing unit 1206 of the interpolation information indicating a location of the interpolated bit.

The depuncturing unit 1206 detects the location of the bit punctured by the puncturing unit 1202 of the transmitter 120A, from the likelihoods input from the demodulator 1205, and adds the likelihood corresponding to the punctured bit to the bit location to obtain all the likelihoods $F_1$ to $F_8$ for the code data items $C_1$ to $C_8$. The likelihood added by the depuncturing unit 1206 depends on the alignment of the code data items $C_1$ to $C_8$, and its value is preset (for example, "0", etc.)

For example, as shown in FIG. 14, if the code data items $C_4$, $C_7$ and $C_8$ are punctured in the puncturing unit 1202 of the transmitter 120A, "0" is set as the input likelihoods $F_4$, $F_7$ and $F_8$ corresponding to the code data items $C_4$, $C_7$ and $C_8$, and all the likelihoods $F_1$ to $F_8$ are obtained.

The depuncturing unit 1206 maintains the likelihoods $F_1$ to $F_8$ as the input likelihoods. In addition, the depuncturing unit 1206 outputs at least one of the maintained likelihoods to the anterior likelihood updating unit 105 and the parity check unit 107, in accordance with the processings of the anterior likelihood updating unit 105 and the parity check unit 107 at the subsequent stage.

In addition, the depuncturing unit 1206 notifies the update schedule forming unit 1207 of the identification information of the bits which are represented by the interpolation information notified from the demodulator 1205 and the puncturing information representing the locations of the punctured bits, respectively.

The update schedule forming unit 1207 detects the bits represented by the identification information input from the depuncturing unit 1206 as the bits of low reliability, forms the order (update schedule) of columns in which the anterior likelihoods are updated in the anterior likelihood updating unit 105, on the basis of the bits of low reliability, and outputs the update schedule to the anterior likelihood updating unit 105. More specifically, the update schedule forming unit 1207 forms an update schedule of updating with priority the anterior likelihoods of the columns corresponding to the punctured bits the bits erased at the transmission time. For example, if the depunctured code data items are $C_4$, $C_7$ and $C_8$, as shown in FIG. 14, the update schedule is $4 \rightarrow 7 \rightarrow 8 \rightarrow 1 \rightarrow 2 \rightarrow 3 \rightarrow 5 \rightarrow 6$.

The LDPC check matrix maintaining unit 104 preliminarily maintains information about an LDPC check matrix (hereinafter called check matrix) as shown in, for example, FIG. 3. The check matrix is preliminarily determined in cooperation with a sender side of the code data. The LDPC check matrix maintaining unit 104 outputs the information on the check matrix to the anterior likelihood updating unit 105 and the parity check unit 107 in response to necessity of each processing.

The anterior likelihood updating unit 105 obtains new anterior likelihoods by using the input likelihoods $F_1$ to $F_8$ input from the depuncturing unit 1206 and the anterior likelihood input from the anterior likelihood maintaining unit 106, in accordance with the information on the check matrix input from the LDPC check matrix maintaining unit 104 and the update schedule input from the update schedule forming unit 1207. The anterior likelihood updating unit 105 outputs the new anterior likelihoods to the anterior likelihood maintaining unit 106. In addition, every time the anterior likelihood updating unit 105 obtains the new anterior likelihoods of all the columns, the anterior likelihood updating unit 105 discriminates that updating the anterior likelihoods is executed at one time, and notifies the parity check unit 107 of the updating.

The anterior likelihood maintaining unit 106 maintains the new anterior likelihoods input from the anterior likelihood updating unit 105. The number of anterior likelihoods maintained by the anterior likelihood maintaining unit 106 is equivalent to the number of 1 in the check matrix. The anterior likelihood maintaining unit 106 outputs the anterior likelihoods which the anterior likelihood maintaining unit 106 maintains to the parity check unit 107 when the parity check unit 107 conducts the parity check, or outputs the anterior likelihoods which the anterior likelihood maintaining unit 106 maintains to the anterior likelihood updating unit 105 when the anterior likelihood updating unit 105 updates the anterior likelihoods.

When the decoding is started, the anterior likelihood maintaining unit 106 maintains all the anterior likelihoods initialized at "0". If the new anterior likelihoods are input from the anterior likelihood updating unit 105, the anterior likelihood maintaining unit 106 deletes the previously maintained anterior likelihoods and maintains the new anterior likelihoods.

The parity check unit 107 calculates the posterior likelihoods on the basis of the input likelihoods $F_1$ to $F_8$ input from the depuncturing unit 1206 and the anterior likelihoods input from the anterior likelihood maintaining unit 106, conducts hard decision based on the posterior likelihoods and obtains code data $C_1$ to $C_8$. The parity check unit 107 conducts parity check of the code data $C_1$ to $C_8$, on the basis of the information on the check matrix input from the LDPC check matrix maintaining unit 104.

If the result of the parity check is preferable or if the number of times of updating the anterior likelihoods notified by the anterior likelihood updating unit 105 reaches a preset number of times, the parity check unit 107 outputs the code data $C_1$ to $C_8$ (or anterior likelihoods of the code data $C_1$ to $C_8$) to a signal processor of a subsequent stage (not shown), to terminate the decoding of the code data $C_1$ to $C_8$.

Figure 15:
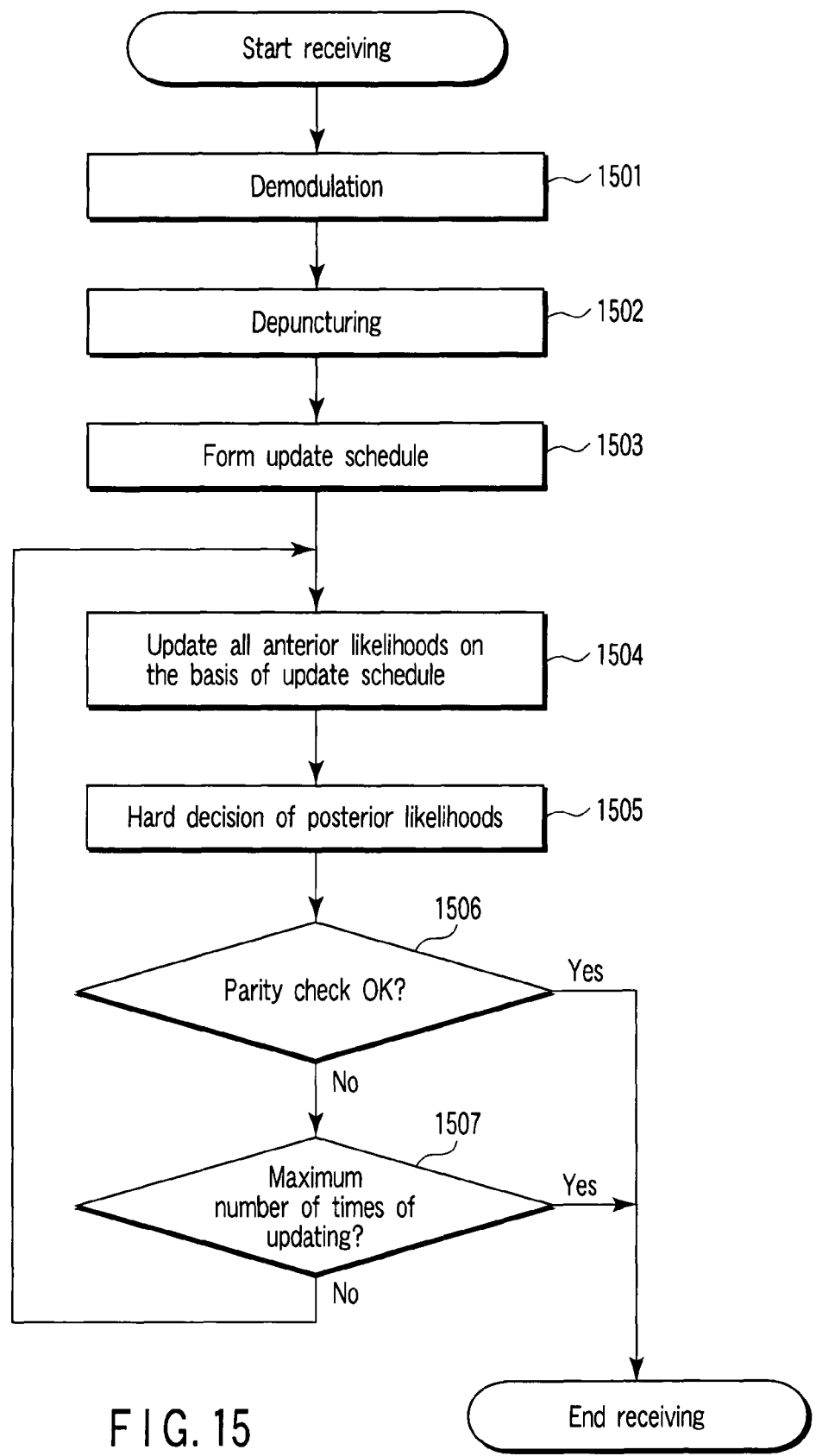
FIG. 15 is a flowchart showing operations of a decoder shown in FIG. 12.

Next, operations of the receiver 120B having the above-described constitution are explained. FIG. 15 shows a flowchart of the operations. The processing shown in this figure are executed for signals corresponding to the code data bits $C_1$ to $C_8$ and transmitted from the modulator 1203 via the channel unit 1204. The processing is repeated for each of the signals.

First, in processing 1501, the demodulator 1205 receives the signals corresponding to the code data items $C_1$ to $C_8$ from the modulator 1203 via the channel unit 1204. Then, the demodulator 1205 calculates and obtains the likelihoods of the respective bits from the receive signals and outputs the obtained likelihoods to the depuncturing unit 1206.

If the erasure error that the bits are erased occurs in the channel unit 1204, the demodulator 1205 compensates the likelihoods of the erased bits with the same value as that of the likelihoods of the puncture bits. Then, the demodulator 1205 notifies the depuncturing unit 1206 of the interpolation information representing the interpolated bits.

In processing 1502, the depuncturing unit 1206 adds the likelihoods corresponding to the bits punctured by the puncturing unit 1202 of the transmitter 120 A to the likelihoods input from the demodulator 1205, and obtains all the likelihoods $F_1$ to $F_8$ for the code data bits $C_1$ to $C_8$. The depuncturing unit 1206 maintains the likelihoods $F_1$ to $F_8$ as the input likelihoods.

In addition, the depuncturing unit 1206 notifies the update schedule forming unit 1207 of the identification information of the bits which are represented by the interpolation information notified from the demodulator 1205 and the puncturing information representing the locations of the punctured bits, respectively.

In processing 1503, the update schedule forming unit 1207 forms the order (update schedule) of columns in which the anterior likelihoods are updated in the anterior likelihood updating unit 105, on the basis of the identification information input from the depuncturing unit 1206, and outputs the update schedule to the anterior likelihood updating unit 105.

In processing 1504, the anterior likelihood updating unit 105 obtains the input likelihoods $F_1$ to $F_8$ from the depuncturing unit 1206, obtains the information on the check matrix from the LDPC check matrix maintaining unit 104, and obtains the anterior likelihoods from the anterior likelihood maintaining unit 106. On the basis of the information on the check matrix and the update schedule input from the update schedule forming unit 1207, the anterior likelihood updating unit 105 updates the anterior likelihoods of all the columns in the check matrix by using the input likelihoods $F_1$ to $F_8$ and the anterior likelihoods.

The anterior likelihoods thus updated are output to the anterior likelihood maintaining unit 106 and maintained in the anterior likelihood maintaining unit 106. The previous anterior likelihoods maintained in the anterior likelihood maintaining unit 106 are abandoned. When the anterior likelihood updating unit 105 requires the new anterior likelihoods, anterior likelihood updating unit 105 notifies the parity check unit 107 of the matter that updating the anterior likelihoods has been executed.

In processing 1505, the parity check unit 107 receiving the notification obtains the latest anterior likelihoods maintained in the anterior likelihood maintaining unit 106 from the anterior likelihood maintaining unit 106, obtains the input likelihoods $F_1$ to $F_8$ from the depuncturing unit 1206, calculates the posterior likelihoods on the basis of the input likelihoods $F_1$ to $F_8$ and the anterior likelihoods, and executes hard decision based on the posterior likelihoods to obtain the code data items $C_1$ to $C_8$.

In processing 1506, the parity check unit 107 obtains the information on the check matrix from the LDPC check matrix maintaining unit 104, and executes the parity check of the code data items $C_1$ to $C_8$ obtained in the processing 1505. If the result of the parity check is preferable, the parity check unit 107 outputs the code data items $C_1$ to $C_8$ (or the anterior likelihoods of the code data items $C_1$ to $C_8$), and terminates the decoding of the code data items $C_1$ to $C_8$. On the other hand, if the result of the parity check is not preferable, the parity check unit 107 executes processing 1507.

In processing 1507, the parity check unit 107 discriminates whether or not number of times i of updating the anterior likelihoods notified in the processing 1504 reaches a preset number of times. If the number of times i of updating the anterior likelihoods reaches the preset number of times, the parity check unit 107 outputs the code data items $C_1$ to $C_8$ (or the anterior likelihoods of the code data items $C_1$ to $C_8$) and terminates the decoding of the code data items $C_1$ to $C_8$. If the number of times i does not reach reaches the preset number of times, the parity check unit 107 executes the processing 1504 again and updates the anterior likelihoods.

In the receiver 120B having the above-described configuration, the anterior likelihoods of columns corresponding to the punctured bits and the bits erased during transmission are updated with priority. Thus, it is possible to prevent the input likelihoods erased at the initial stage of iteration from propagating to updating of the anterior likelihoods corresponding to the other bits, and decoding can be executed at a small number of times of iteration. In addition, errors in the decoded data can be reduced.

In the above-described embodiment, the schedule of updating the anterior likelihoods by using with priority the input likelihoods of low reliability is formed without separating the data bits $C_1$ to $C_4$ and the parity bits $C_5$ to $C_8$, and the anterior likelihoods are updated in accordance with the schedule.

Instead of this, however, in relation to the columns corresponding to the parity bits $C_5$ to $C_8$, a schedule of updating the anterior likelihoods, with priority, about the columns corresponding to the input likelihoods of lower reliability, may be formed and the anterior likelihoods of the parity bits $C_5$ to $C_8$ may be updated on the basis of this schedule. Then, in relation to the columns corresponding to the parity bits $C_1$ to $C_4$, an update schedule of updating the anterior likelihoods, with priority, about the columns corresponding to the input likelihoods of lower reliability may be formed and the anterior likelihoods of the parity bits $C_1$ to $C_4$ may be updated on the basis of this schedule.

In the above-described decoding, since the anterior likelihoods are updated in order by the column unit, the updated anterior likelihoods of high reliability in the latter columns can be used. For this reason, if the anterior likelihoods relating to the columns corresponding to the parity bits $C_5$ to $C_8$ are updated and then the anterior likelihoods of $C_1$ to $C_4$ are updated, errors in the latter updated data bits $C_1$ to $C_4$ can be reduced. For example, in the example shown in FIG. 13 and FIG. 14, errors in the data bits are reduced by setting the update schedule at 7→8→5→6→4→1→2→3.

In addition, to reduce the correlation in time of the code data bits in the communication system shown in FIG. 12, an interleaver configured to spread in time the code data may be provided between the puncturing unit 1202 and the modulator 1203 and a deinterleaver configured to de-interleave the code data spread by the interleaver in the original sequence may be provided between the demodulator 1205 and the depuncturing unit 1206.

Next, a communication system according to a fifth embodiment of the present invention is described. The decoder of the present invention is applied to the communication system. FIG. 16 shows a configuration of the decoder, which comprises a transmitter 160A and a receiver 160B. In this communication system, the transmitter 160A encodes the transmit data with LDPC codes and transmits the encoded transmit data. The receiver 160B receives and decodes the transmit data received through a channel unit 1204 peculiar to the communication system, and obtains receive data.

Elements shown in FIG. 16 having like or similar functions to those shown in FIG. 1 and FIG. 12 are denoted by similar reference numbers and are not described in detail here, and different constituent elements are focused. As for the receiver 160B, a configuration concerning the decoding alone is described in the following descriptions, but the decoder 160B also comprises a configuration of an encoder which executes encoding.

The transmitter 160A comprises an LDPC encoder 1201 and a multi level modulation unit 1603.

The LDPC encoder 1201 generates the code data $C_1$ to $C_8$ by encoding the transmit data with the LDPC codes, and outputs the code data to the multi level modulation unit 1603.

The multi level modulation unit 1603 processes carrier waves by multi level modulation with the code data $C_1$ to $C_8$ input from the LDPC encoder 1201, converts the processed carrier waves into signals suitable for transmission through the channel unit 1204, and outputs the signals to the transmission path. The multi level modulation unit 1603 employs a multi level modulation scheme of executing modulation to allocate at least two bits to one signal point at once.

Figure 17:
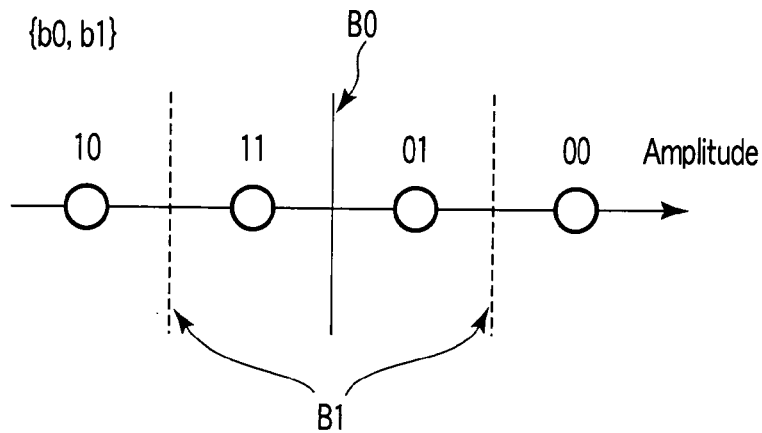
FIG. 17 is an illustration showing modulation in a multi level modulation unit shown in FIG. 16.

Examples of the scheme are, for example, QAM (Quadrature Amplitude Modulation) and PAM (Pulse Amplitude Modulation). In the following descriptions, the multi level modulation unit 1603 adopts 4 PAM illustrated in FIG. 17. In the 4 PAM, bits are allocated to two labels {b0, b1}, respectively, by allocating bits to four levels of signal amplitude as illustrated in FIG. 17.

By the channel unit 1204 in the transmission path, distortion peculiar to the communication system such as Gauss heat noise, multipath fading, etc. is added to the signal output to the transmission path, and the signal is transmitted to the receiver 160B.

The receiver 160B comprises a multi level demodulation unit 1605, an update schedule forming unit 1610, the LDPC check matrix maintaining unit 104, an anterior likelihood updating unit 105, an anterior likelihood maintaining unit 106 and a parity check unit 107.

The multi level demodulation unit 1605 receives and demodulates the signals output from the multi level modulation unit 1603 via the channel unit 1204, obtains the likelihoods $F_1$ to $F_8$ of the respective code data items $C_1$ to $C_8$ by calculating the likelihood of each bit from the demodulated receive signals, and maintains the likelihoods as input likelihoods. The multi level demodulation unit 1605 outputs at least one of the maintained likelihoods to the anterior likelihood updating unit 105 and the parity check unit 107, in accordance with the processings of the anterior likelihood updating unit 105 and the parity check unit 107 at the subsequent stage.

In addition, the multi level demodulation unit 1605 detects mapping information indicating on which label (label b0 or label b1) each of bits included in the code data is mapped by 4 PAM, and outputs the mapping information to the update schedule forming unit 1610. The multi level demodulation unit 1605 discriminates "0" or "1" by discriminating the level of the bits corresponding to the label b0, of two labels {b0, b1}, on discrimination surface B0, and also discriminates "0" or "1" by discriminating the level of the bits corresponding to the label b1, of two labels {b0, b1}, on discrimination surface B1.

On the basis of the mapping information input from the multi level demodulation unit 1605, the update schedule forming unit 1610 detects the likelihoods corresponding to the bits allocated to the label on which an error can easily be made, as likelihoods having lower reliability than that of the likelihoods corresponding to the other bits. On the basis of the detected reliability, the update schedule forming unit 1610 forms the order (update schedule) of columns in which the anterior likelihoods are updated in the anterior likelihood updating unit 105, and outputs the update schedule to the anterior likelihood updating unit 105. More specifically, the update schedule forming unit 1610 forms an update schedule of updating with priority the anterior likelihoods of the columns corresponding to the bits allocated to the label on which an error can easily be made. In the multi level modulation, the probability of the bit error is changed due to the allocated label.

Figure 18:
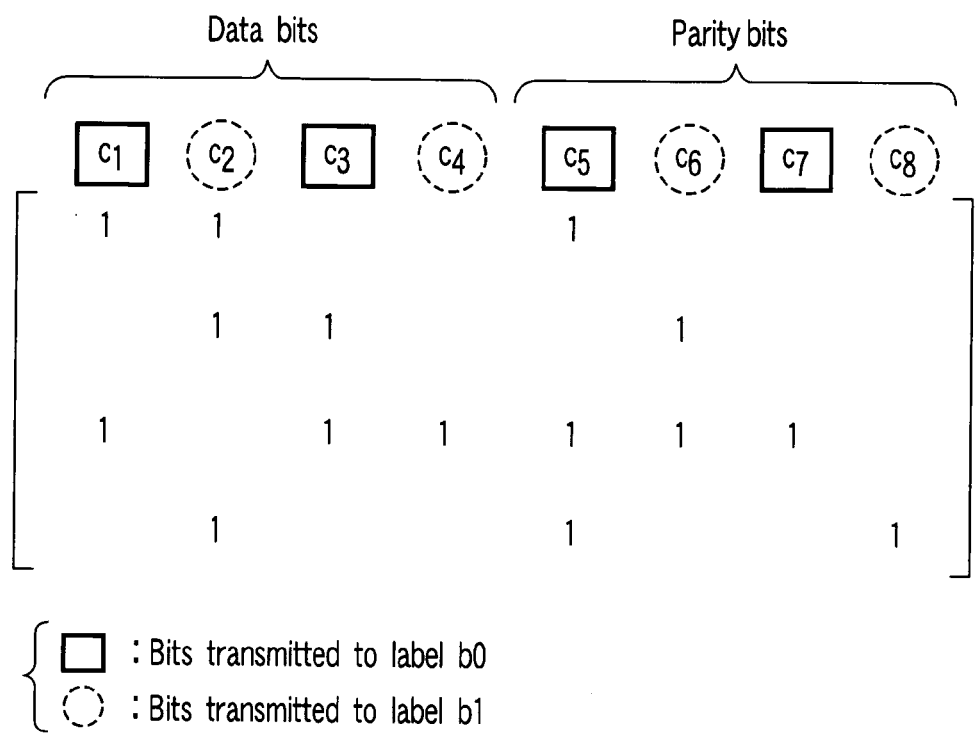
FIG. 18 is an illustration showing correspondence of code data and labels.

In 4 PAM of FIG. 17, there are two labels b0 and b1. The discrimination surface B1 of the label b1 is narrower than the discrimination surface B0 of the label b0 and, in general, an error can easily occur on the label b1. For this reason, the anterior likelihood updating unit 105 forms a schedule of updating with priority the likelihoods of the bits allocated to the label on which an error can easily be made, and can thereby prevent propagation of the likelihood information of low reliability. For example, if the code data items $C_1$, $C_3$, $C_5$ and $C_7$ correspond to the label b0 and the code data items $C_2$, $C_4$, $C_6$, and $C_8$ correspond to the b1 as shown in FIG. 18, the update schedule forming unit 1610 forms the update schedule $I_2 \to I_4 \to I_6 \to I_8 \to I_3 \to I_5 \to I_7$.

The LDPC check matrix maintaining unit 104 preliminarily maintains information about an LDPC check matrix (hereinafter called check matrix) as shown in, for example, FIG. 3. The check matrix is preliminarily determined in cooperation with a sender side of the code data. The LDPC check matrix maintaining unit 104 outputs the information on the check matrix to the anterior likelihood updating unit 105 and the parity check unit 107 in response to necessity of each processing.

The anterior likelihood updating unit 105 obtains new anterior likelihoods of all the columns by using the input likelihoods $F_1$ to $F_8$ input from the multi level demodulation unit 1605 and the anterior likelihood input from the anterior likelihood maintaining unit 106, in accordance with the information on the check matrix input from the LDPC check matrix maintaining unit 104 and the update schedule input from the update schedule forming unit 1610. The anterior likelihood updating unit 105 outputs the new anterior likelihoods to the anterior likelihood maintaining unit 106. In addition, every time the anterior likelihood updating unit 105 obtains the new anterior likelihoods of all the columns, the anterior likelihood updating unit 105 discriminates that updating the anterior likelihoods is executed at one time, and notifies the parity check unit 107 of the updating.

The anterior likelihood maintaining unit 106 maintains the new anterior likelihoods input from the anterior likelihood updating unit 105. The number of anterior likelihoods maintained by the anterior likelihood maintaining unit 106 is equivalent to the number of 1 in the check matrix. The anterior likelihood maintaining unit 106 outputs the anterior likelihoods which the anterior likelihood maintaining unit 106 maintains to the parity check unit 107 when the parity check unit 107 conducts the parity check, or outputs the anterior likelihoods which the anterior likelihood maintaining unit 106 maintains to the anterior likelihood updating unit 105 when the anterior likelihood updating unit 105 updates the anterior likelihoods.

When the decoding is started, the anterior likelihood maintaining unit 106 maintains all the anterior likelihoods initialized at "0". If the new anterior likelihoods are input from the anterior likelihood updating unit 105, the anterior likelihood maintaining unit 106 deletes the previously maintained anterior likelihoods and maintains the new anterior likelihoods.

The parity check unit 107 calculates the posterior likelihoods on the basis of the input likelihoods $F_1$ to $F_8$ input from the multi level demodulation unit 1605 and the anterior likelihoods input from the anterior likelihood maintaining unit 106, conducts hard decision based on the posterior likelihoods and obtains code data $C_1$ to $C_8$. The parity check unit 107 conducts parity check of the code data $C_1$ to $C_8$, on the basis of the information on the check matrix input from the LDPC check matrix maintaining unit 104.

If the result of the parity check is preferable or if the number of times of updating the anterior likelihoods notified by the anterior likelihood updating unit 105 reaches a preset number of times, the parity check unit 107 outputs the code data $C_1$ to $C_8$ (or anterior likelihoods of the code data $C_1$ to $C_8$) to a signal processor of a subsequent stage (not shown), to terminate the decoding of the code data $C_1$ to $C_8$.

Figure 19:
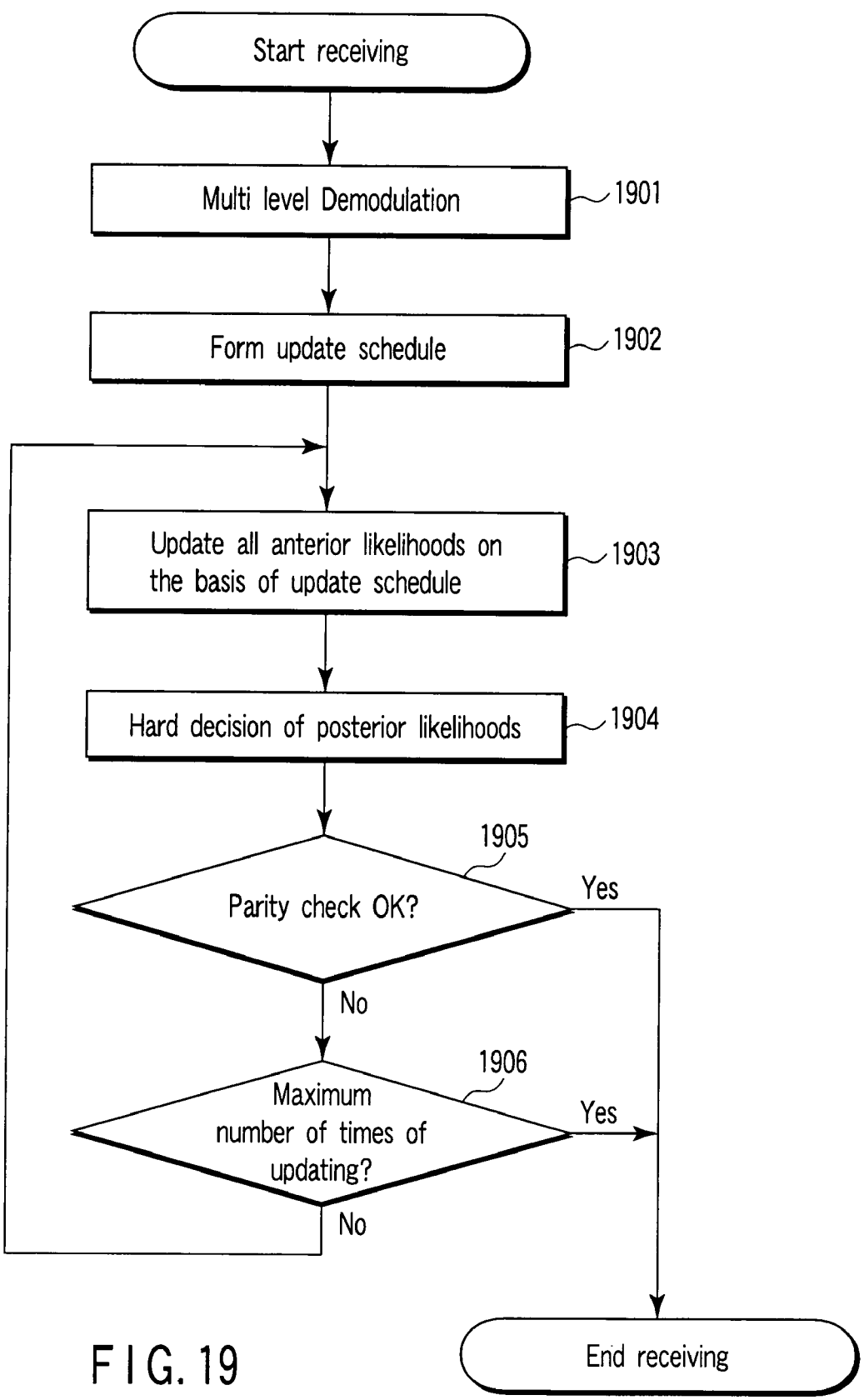
FIG. 19 is a flowchart showing operations of a decoder shown in FIG. 16.

Next, operations of the receiver 160B having the above-described configuration are explained. FIG. 19 shows a flowchart of the operations. The processing shown in this figure are executed for signals corresponding to the code data bits $C_1$ to $C_8$ and transmitted from the modulator 2003 via the channel unit 1204. The processing is repeated for each of the signals.

First, in processing 1901, the multi level demodulation unit 1605 receives the signals corresponding to the code data items $C_1$ to $C_8$ from the multi level modulation unit 1603 via the channel unit 1204. Then, the multi level demodulation unit 1605 calculates and obtains the likelihoods $F_1$ to $F_8$ of the respective bits of the code data items $C_1$ to $C_8$ from the receive signals and maintains the likelihoods $F_1$ to $F_8$ as the input likelihoods. In addition, the multi level demodulation unit 1605 detects the mapping information indicating on which label (b0 or b1) each of the bits of the code data items $C_1$ to $C_8$ is mapped by the 4 PAM and outputs the mapping information to the update schedule forming unit 1610.

In processing 1902, the update schedule forming unit 1610 forms the order (update schedule) of columns in which the anterior likelihoods are updated in the anterior likelihood updating unit 105, on the basis of the mapping information input from the multi level demodulation unit 1605, and outputs the update schedule to the anterior likelihood updating unit 105.

In processing 1903, the anterior likelihood updating unit 105 obtains the input likelihoods $F_1$ to $F_8$ from the multi level demodulation unit 1605, obtains the information on the check matrix from the LDPC check matrix maintaining unit 104, and obtains the anterior likelihoods from the anterior likelihood maintaining unit 106. On the basis of the information on the check matrix and the update schedule input from the update schedule forming unit 1610, the anterior likelihood updating unit 105 updates the anterior likelihoods of all the columns in the check matrix by using the input likelihoods $F_1$ to $F_8$ and the anterior likelihoods.

The anterior likelihoods thus updated are output to the anterior likelihood maintaining unit 106 and maintained in the anterior likelihood maintaining unit 106. The previous anterior likelihoods maintained in the anterior likelihood maintaining unit 106 are abandoned. When the anterior likelihood updating unit 105 requires the new anterior likelihoods, anterior likelihood updating unit 105 notifies the parity check unit 107 of the matter that updating the anterior likelihoods has been executed.

In processing 1904, the parity check unit 107 receiving the notification obtains the latest anterior likelihoods maintained in the anterior likelihood maintaining unit 106 from the anterior likelihood maintaining unit 106, obtains the input likelihoods $F_1$ to $F_8$ from the multi level demodulation unit 1605, calculates the posterior likelihoods on the basis of the input likelihoods $F_1$ to $F_8$ and the anterior likelihoods, and executes hard decision based on the posterior likelihoods to obtain the code data items $C_1$ to $C_8$.

In processing 1905, the parity check unit 107 obtains the information on the check matrix from the LDPC check matrix maintaining unit 104, and executes the parity check of the code data items $C_1$ to $C_8$ obtained in the processing 1904. If the result of the parity check is preferable, the parity check unit 107 outputs the code data items $C_1$ to $C_8$ (or the anterior likelihoods of the code data items $C_1$ to $C_8$), and terminates the decoding of the code data items $C_1$ to $C_8$. On the other hand, if the result of the parity check is not preferable, the parity check unit 107 executes processing 1906.

In processing 1906, the parity check unit 107 discriminates whether or not number of times i of updating the anterior likelihoods notified in the processing 1903 reaches a preset number of times. If the number of times i of updating the anterior likelihoods reaches the preset number of times, the parity check unit 107 outputs the code data items $C_1$ to $C_8$ (or the anterior likelihoods of the code data items $C_1$ to $C_8$) and terminates the decoding of the code data items $C_1$ to $C_8$. If the number of times i does not reach reaches the preset number of times, the parity check unit 107 executes the processing 1903 again and updates the anterior likelihoods.

In the receiver 160B having the above-described configuration, the anterior likelihoods of columns corresponding to the bits allocated to the label on which an error can easily be made by the multi level modulation are updated with priority. Thus, it is possible to prevent the likelihood information which can easily include an error and which has low reliability, from propagating to the updating of the anterior likelihoods corresponding to the other bits, and decoding can be executed at a small number of times of iteration. In addition, errors in the decoded data can be reduced.

In the above-described embodiment, the schedule of updating the anterior likelihoods by using with priority the input likelihoods of low reliability is formed without separating the data bits $C_1$ to $C_4$ and the parity bits $C_5$ to $C_8$, and the anterior likelihoods are updated in accordance with the schedule.

Instead of this, however, in relation to the columns corresponding to the parity bits $C_5$ to $C_8$, a schedule of updating the anterior likelihoods, with priority, about the columns corresponding to the input likelihoods of lower reliability, may be formed and the anterior likelihoods of the parity bits $C_5$ to $C_8$ may be updated on the basis of this schedule. Then, in relation to the columns corresponding to the parity bits $C_1$ to $C_4$, an update schedule of updating the anterior likelihoods, with priority, about the columns corresponding to the input likelihoods of lower reliability may be formed and the anterior likelihoods of the parity bits $C_1$ to $C_4$ may be updated on the basis of this schedule.

In the above-described decoding, since the anterior likelihoods are updated in order by the column unit, the updated anterior likelihoods of high reliability in the latter columns can be used. For this reason, if the anterior likelihoods relating to the columns corresponding to the parity bits $C_5$ to $C_8$ are updated and then the anterior likelihoods of $C_1$ to $C_4$ are updated, errors in the latter updated data bits $C_1$ to $C_4$ can be reduced. For example, in the example shown in FIG. 18, errors in the data bits are reduced by setting the update schedule at 6→8→5→7→2→4→1→3.

In addition, to reduce the correlation in time of the code data bits, in the communication system shown in FIG. 16, an interleaver configured to spread in time the code data may be provided between the LDPC encoder 1201 and the multi level modulation unit 1603 and a deinterleaver configured to de-interleave the code data spread by the interleaver in the original sequence may be provided between the multi level modulation unit 1605, and the anterior likelihood updating unit 105 and the parity check unit 107.

Next, a communication system according to a sixth embodiment of the present invention is described. The decoder of the present invention is applied to the communication system. FIG. 20 shows a configuration of the decoder, which comprises a transmitter 200A and a receiver 200B. In this communication system, the transmitter 200A encodes the transmit data with LDPC codes and transmits the encoded transmit data. The receiver 200B receives and decodes the transmit data received through a channel unit 1204 peculiar to the communication system, and obtains receive data. Iterative demodulation is executed with the receive data obtained by decoding.

Elements shown in FIG. 20 having like or similar functions to those shown in FIG. 1 and FIG. 12 are denoted by similar reference numbers and are not described in detail here, and different constituent elements are focused. As for the receiver 200B, a configuration concerning the decoding alone is described in the following descriptions, but the decoder 200B also comprises a configuration of an encoder which executes encoding.

The transmitter 200A comprises an LDPC encoder 1201, an interleaver 2002, and a modulator 2003.

The LDPC encoder 1201 generates code data $C_1$ to $C_8$ by encoding the transmit data with the LDPC codes, and outputs the code data to the interleaver 2002.

The interleaver 2002 spreads the code data $C_1$ to $C_8$ by bit unit in a time direction and outputs the code data to the modulator 2003.

The modulator 2003 modulates a carrier wave with the bit data input from the interleaver 2002, converts the carrier wave into a signal suitable for transmission via the channel unit 1204, and outputs the converted signal to a transmission path. In the modulator 2003, a modulation scheme such as BPSK (Binary Phase Shift Keying) of modulating by 1 bit, and a multi level modulation scheme of modulating at least two bits at one time can be employed.

By the channel unit 1204 in the transmission path, distortion peculiar to the communication system such as Gauss heat noise, multipath fading, etc. is added to the signal output to the transmission path, and the signal is transmitted to the receiver 200B.

The receiver 200B comprises a demodulator 2005, a deinterleaver 2006, the sorting unit 102, an update schedule forming unit 2012, the LDPC check matrix maintaining unit 104, an anterior likelihood updating unit 105, an anterior likelihood maintaining unit 106, a parity check unit 2007 and an interleaver 2013.

The demodulator 2005 receives and demodulates a signal output from the modulator 2003 via the channel unit 1204 and maintains the demodulated receive signal in a buffer. Then, the demodulator 2005 executed iterative demodulation with the receive signal and the anterior likelihoods of the respective bits input from the interleaver 2013, obtains the likelihoods of the respective bits of the bit data and outputs the obtained likelihoods to the deinterleaver 2006.

The demodulator 2005 counts the number of times of iterative demodulation for the same receive signal and notifies the number of times of the parity check unit 2007 and the update schedule forming unit 2012. At the initial demodulation, the demodulator 2005 uses the only receive signal maintained in the buffer since the anterior likelihoods from the interleaver 2013 are not input.

The deinterleaver 2006 de-interleaves the likelihoods of the respective bits input from the demodulator 2005 by operations of a sequence which is opposite to the sequence of the spreading operations in the interleaver 2002 of the transmitter 200A, and de-interleaves the code data items $C_1$ to $C_8$ in the initial sequence. In other words, the deinterleaver 2006 obtains the likelihoods $F_1$ to $F_8$. The deinterleaver 2006 maintains the likelihoods $F_1$ to $F_8$ as the input likelihoods. In addition, the deinterleaver 2006 outputs at least one of the maintained likelihoods to the sorting unit 102, the anterior likelihood updating unit 105 and the parity check unit 2007, in accordance with the processings of the anterior likelihood updating unit 105 and the parity check unit 2007 at the subsequent stage.

The sorting unit 102 sorts the likelihoods $F_1$ to $F_8$ of the code data input from the deinterleaver 2006, on the basis of a predetermined standard. In this embodiment, the predetermined standard is an order of smaller absolute values of the input likelihoods $F_1$ to $F_8$. For this reason, the sorting unit 102 detects the absolute values of the input likelihoods $F_1$ to $F_8$, and sorts them in the order of smaller values. The sorting unit 102 forms information on index (hereinafter called index information) of the sorted input likelihoods $F_1$ to $F_8$ and outputs the index information to the update schedule forming unit 2012.

The update schedule forming unit 2012 forms the order (update schedule) of columns in which the anterior likelihoods are updated in the anterior likelihood updating unit 105, on the basis of the number of times of the iterative demodulation notified from the demodulator 2005 and the index information input from the sorting unit 102, and outputs the update schedule to the anterior likelihood updating unit 105.

More specifically, if the number of times of the iterative demodulation notified from the demodulator 2005 is smaller than the preset number of times, the update schedule forming unit 2012 forms an update schedule of updating with priority the anterior likelihoods of the columns corresponding to the bits in which the absolute values of the input likelihoods $F_1$ to $F_8$ are smaller, on the basis of the index information.

If the number of times of the iterative demodulation notified from the demodulator 2005 reaches the preset number of times, the update schedule forming unit 2012, referring to the index information, updates the anterior likelihoods of the columns corresponding to the bits in which the absolute values of the input likelihoods $F_5$ to $F_8$ are smaller, of the anterior likelihoods corresponding to the parity bits $C_5$ to $C_8$, and then updates the anterior likelihoods of the columns corresponding to the bits in which the absolute values of the input likelihoods $F_1$ to $F_4$ are smaller, of the anterior likelihoods corresponding to the parity bits $C_1$ to $C_4$, in order to update the anterior likelihoods corresponding to the parity bits $C_5$ to $C_8$ with a higher priority than the anterior likelihoods corresponding to the data bits $C_1$ to $C_4$.

The anterior likelihood updating unit 105 obtains new anterior likelihoods of all the columns by using the likelihoods $F_1$ to $F_8$ of the code data input from the deinterleaver 2006 and the anterior likelihoods input from the anterior likelihood maintaining unit 106, in accordance with the information on the check matrix input from the LDPC check matrix maintaining unit 104 and the update schedule input from the update schedule forming unit 2012. The anterior likelihood updating unit 105 outputs the new anterior likelihoods to the anterior likelihood maintaining unit 106. In addition, every time the anterior likelihood updating unit 105 obtains the new anterior likelihoods of all the columns, the anterior likelihood updating unit 105 discriminates that updating the anterior likelihoods is executed at one time, and notifies the parity check unit 2007 of the updating.

The anterior likelihood maintaining unit 106 maintains the new anterior likelihoods input from the anterior likelihood updating unit 105. The number of anterior likelihoods maintained by the anterior likelihood maintaining unit 106 is equivalent to the number of 1 in the check matrix. The anterior likelihood maintaining unit 106 outputs the anterior likelihoods which the anterior likelihood maintaining unit 106 maintains to the parity check unit 2007 when the parity check unit 2007 conducts the parity check, or outputs the anterior likelihoods which the anterior likelihood maintaining unit 106 maintains to the anterior likelihood updating unit 105 when the anterior likelihood updating unit 105 updates the anterior likelihoods.

When the decoding is started, the anterior likelihood maintaining unit 106 maintains all the anterior likelihoods initialized at "0". If the new anterior likelihoods are input from the anterior likelihood updating unit 105, the anterior likelihood maintaining unit 106 deletes the previously maintained anterior likelihoods and maintains the new anterior likelihoods.

The parity check unit 2007 calculates the posterior likelihoods on the basis of the likelihoods $F_1$ to $F_8$ input from the deinterleaver 2006 and the anterior likelihoods input from the anterior likelihood maintaining unit 106, conducts hard decision based on the posterior likelihoods and obtains code data $C_1$ to $C_8$. The parity check unit 2007 conducts parity check of the code data $C_1$ to $C_8$, on the basis of the information on the check matrix input from the LDPC check matrix maintaining unit 104.

If the result of the parity check is preferable or if the number of times of updating the anterior likelihoods notified by the anterior likelihood updating unit 105 reaches the preset number of times, the parity check unit 2007 outputs the code data $C_1$ to $C_8$ (or anterior likelihoods of the code data $C_1$ to $C_8$) to a signal processor of a subsequent stage (not shown), in order to terminate the decoding of the code data $C_1$ to $C_8$.

If the result of the parity check is not preferable and the number of times of updating the anterior likelihoods reaches the preset number of times, and if the number of times of the iterative demodulation notified by the demodulator 2005 does not reach the preset number of times, the parity check unit 2007 outputs the anterior likelihoods of the code data $C_1$ to $C_8$ to the interleaver 2013.

The interleaver 2013 spreads the anterior likelihoods of the code data $C_1$ to $C_8$ input from the parity check unit 2007, similarly to the interleaver 2002 of the transmitter 200A, and outputs the anterior likelihoods to the demodulator 2005.

Figure 21:
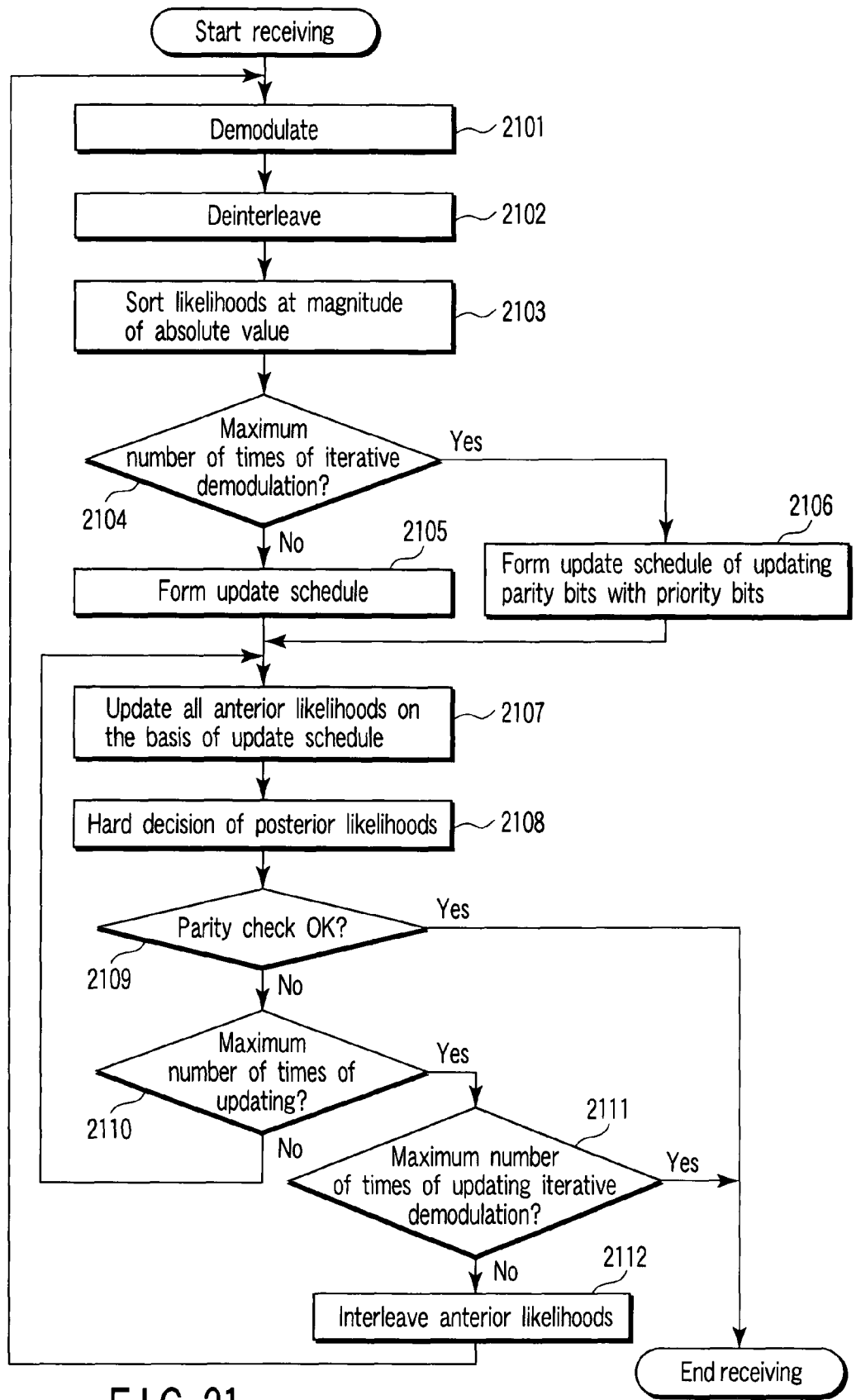
FIG. 21 is a flowchart showing operations of a decoder shown in FIG. 20.

Next, operations of the receiver 200B having the above-described configuration are explained. FIG. 21 shows a flowchart of the operations. The processing shown in this figure are executed for signals corresponding to the code data bits $C_1$ to $C_8$ and transmitted from the modulator 2003 via the channel unit 1204. The processing is repeated for each of the signals.

First, in processing 2101, the demodulator 2005 receives and demodulates the signals corresponding to the code data items $C_1$ to $C_8$ from the modulator 2003 via the channel unit 1204, and maintains demodulated receive signals in the buffer. Then, the demodulator 2005 executes iterative demodulation using the receive signals and the anterior likelihoods of the respective bits input from the interleaver 2013, obtains the likelihoods of the respective bits of the bit data and outputs the obtained likelihoods to the deinterleaver 2006.

The demodulator 2005 counts the number of times of the iterative demodulation for the same receive signal and notifies the number of times of the parity check unit 2007 and the update schedule forming unit 2012.

At the initial demodulation, the demodulator 2005 uses the only receive signal maintained in the buffer since the anterior likelihoods from the interleaver 2013 are not input.

In processing 2102, the deinterleaver 2006 de-interleaves the likelihoods of the respective bits input from the demodulator 2005 in the processing 2101 by the operations of the sequence which is opposite to the sequence of the spreading operations in the interleaver 2002 of the transmitter 200A, and de-interleaves the code data items $C_1$ to $C_8$ in the initial sequence. In other words, the deinterleaver 2006 obtains the likelihoods $F_1$ to $F_8$. The deinterleaver 2006 maintains the likelihoods $F_1$ to $F_8$ as the input likelihoods.

In processing 2103, the sorting unit 102 obtains the likelihoods $F_1$ to $F_8$ of the code data from the deinterleaver 2006 and sorts them in an order of smaller values. The sorting unit 102 forms the index information of the sorted input likelihoods $F_1$ to $F_8$ and outputs the index information to the update schedule forming unit 2012.

In processing 2104, the update schedule forming unit 2012 discriminates whether or not the number of times of the iterative demodulation notified from the demodulator 2005 in the processing 2101 reaches the preset number of times. If the number of times of the iterative demodulation does not reach the preset number of times, the operations proceed to processing 2105. If the number of times of the iterative demodulation does not reach the preset number of times, the operations proceed to processing 2106.

In processing 2105, the update schedule forming unit 2012 forms the update schedule of updating the anterior likelihoods of columns corresponding to the bits in which the absolute values of the input likelihoods $F_1$ to $F_8$ are smaller, on the basis of the index information obtained from the sorting unit 102.

In processing 2106, the update schedule forming unit 2012, referring to the index information obtain from the sorting unit 102, updates the anterior likelihoods of the columns corresponding to the bits in which the absolute values of the input likelihoods $F_5$ to $F_8$ are smaller, of the anterior likelihoods corresponding to the parity bits $C_5$ to $C_8$ obtained from the sorting unit 102, and then updates the anterior likelihoods of the columns corresponding to the bits in which the absolute values of the input likelihoods $F_1$ to $F_4$ are smaller, of the anterior likelihoods corresponding to the parity bits $C_1$ to $C_4$, in order to update the anterior likelihoods corresponding to the parity bits $C_5$ to $C_8$ with a higher priority than the anterior likelihoods corresponding to the data bits $C_1$ to $C_4$.

In processing 2107, the anterior likelihood updating unit 105 obtains the input likelihoods $F_1$ to $F_8$ from the deinterleaver 2006, obtains the information on the check matrix from the LDPC check matrix maintaining unit 104, and obtains the anterior likelihoods from the anterior likelihood maintaining unit 106. On the basis of the information on the check matrix and the update schedule input from the update schedule forming unit 2012, the anterior likelihood updating unit 105 updates the anterior likelihoods of all the columns in the check matrix by using the input likelihoods $F_1$ to $F_8$ and the anterior likelihoods.

The anterior likelihoods thus updated are output to the anterior likelihood maintaining unit 106 and maintained in the anterior likelihood maintaining unit 106. The previous anterior likelihoods maintained in the anterior likelihood maintaining unit 106 are abandoned. When the anterior likelihood updating unit 105 requires the new anterior likelihoods, anterior likelihood updating unit 105 notifies the parity check unit 2007 of the matter that updating the anterior likelihoods has been executed.

In processing 2108, the parity check unit 2007 receiving the notification obtains the latest anterior likelihoods maintained in the anterior likelihood maintaining unit 106 from the anterior likelihood maintaining unit 106, obtains the input likelihoods $F_1$ to $F_8$ from the deinterleaver 2006, calculates the posterior likelihoods on the basis of the input likelihoods $F_1$ to $F_8$ and the anterior likelihoods, and executes hard decision based on the posterior likelihoods to obtain the code data items $C_1$ to $C_8$.

In processing 2109, the parity check unit 2007 obtains the information on the check matrix from the LDPC check matrix maintaining unit 104, and executes the parity check of the code data items $C_1$ to $C_8$ obtained in the processing 2108. If the result of the parity check is preferable, the parity check unit 2007 outputs the code data items $C_1$ to $C_8$ (or the anterior likelihoods of the code data items $C_1$ to $C_8$), and terminates the decoding of the code data items $C_1$ to $C_8$. On the other hand, if the result of the parity check is not preferable, the parity check unit 2007 executes processing 1507.

In processing 2110, the parity check unit 2007 discriminates whether or not the number of times i of updating the anterior likelihoods notified in the processing 2107 reaches the preset number of times. If the number of times i of updating the anterior likelihoods reaches the preset number of times, the parity check unit 2007 executes the processing 2111. If the number of times i does not reach reaches the preset number of times, the parity check unit 2007 executes the processing 2107 again and updates the anterior likelihoods.

In processing 2111, the parity check unit 2007 discriminates whether or not the number of times of the iterative demodulation notified from the demodulator 2005 in the processing 2101 reaches the preset number of times. If the number of times of the iterative demodulation does not reach the preset number of times, the operations proceed to processing 2112. If the number of times of the iterative demodulation reaches the preset number of times, the parity check unit 2007 outputs the code data items $C_1$ to $C_8$ (or the anterior likelihoods of the code data items $C_1$ to $C_8$), and terminates the decoding of the code data items $C_1$ to $C_8$.

In processing 2112, the parity check unit 2007 outputs the anterior likelihoods of the code data $C_1$ to $C_8$ to the interleaver 2013. The interleaver 2013 spreads the anterior likelihoods of the code data $C_1$ to $C_8$ input from the parity check unit 2007, similarly to the interleaver 2002 of the transmitter 200A, and outputs the anterior likelihoods to the demodulator 2005. After that, the operations proceed to the processing 2101.

In the receiver 200B having the above-described configuration, the iterative demodulation is executed. The iterative demodulation is executed while updating the anterior likelihoods by using with priority the input likelihoods having low reliability, without separating the data bits $C_1$ to $C_4$ and the parity bits $C_5$ to $C_8$, until the number of times of the iterative demodulation reaches the preset number of times. If the number of times of the iterative demodulation reaches the preset number of times, the anterior likelihoods of the parity bits $C_5$ to $C_8$ are updated with a higher priority than the anterior likelihoods of the parity bits $C_5$ to $C_8$. Therefore, in the receiver 200B having the above-described configuration, errors in the receive data can be reduced since the effect of reducing data errors caused by the iterative demodulation can be sufficiently achieved.

Figure 22:
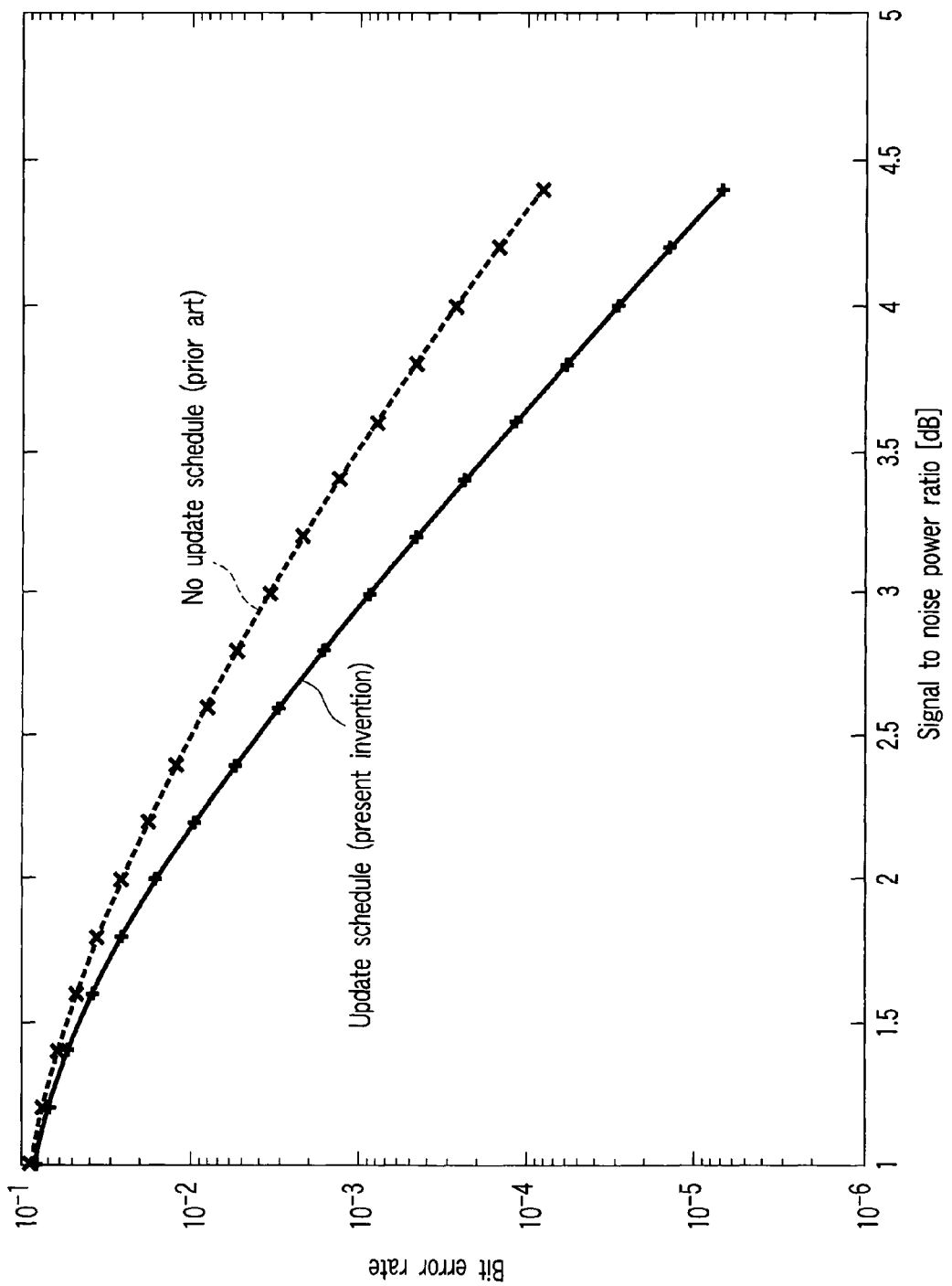
FIG. 22 is a graph showing a bit error rate characteristic of the decoder shown in FIG. 1.

FIG. 22 shows a bit error rate (BER) characteristic in a Gauss heat noise communication path in a case of applying the decoder of the first embodiment by computer simulation. The check matrix of the LDPC code uses an irregular LDPC code having the code length of 1004 bits, the parity length of 502 bits and the coding rate of 0.5. The maximum number of times of iterative decoding is set at three. FIG. 22 indicates that preferable BER characteristics can be obtained from the present invention in which the sequence of updating is determined, as compared with the conventional scheme in which the sequence of updating is not determined.

In the above-described embodiments, execution of the iterative demodulation has been described. However, the advantages of iteration can be sufficiently achieved even if the present invention is applied to a receiver executing the iteration as employed in a MIMO (Multi-Input Multi-Output) system and a CDMA (Code Division Multiple Access) system.

The present invention is not limited to the embodiments described above but the constituent elements of the invention can be modified in various manners without departing from the spirit and scope of the invention. Various aspects of the invention can also be extracted from any appropriate combination of a plurality of constituent elements disclosed in the embodiments. Some constituent elements may be deleted in all of the constituent elements disclosed in the embodiments. The constituent elements described in different embodiments may be combined arbitrarily.

For example, the above-described embodiments have focused mainly on the radio communication system, but are not limited to the communication field. The present invention can also be applied to any device that executes the LDPC encoding. As its example, the present invention can also be employed in magnetic record systems and optical disk systems, and various storage systems such as semiconductor memories, etc. In these systems, data are subjected to the LDPC encoding and recorded in storage mediums, and then the read code data are decoded to obtain the data.

In addition, the configurations of the decoders according to the respective embodiments are illustrated in the block diagrams of FIGS. 1, 8, 10, 12, 16 and 20. However, each of the configurations can be implemented by the DSP (Digital Signal Processor) and a control program stored in a memory unit (not shown). In other words, the configuration can be implemented when the DSP operates under the control program and functions as the configuration.

Needless to say, the present invention can also be variously modified within a scope which does not depart from the gist of the present invention.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A decoder comprising:
    an acquisition unit configured to acquire first respective likelihoods of data bits and second respective likelihoods of parity bits, the data bits and the parity bits included in code data obtained by LDPC-encoding the data bits with a low density parity check matrix;
    a detecting unit configured to detect reliabilities of the first respective likelihoods and the second respective likelihoods;
    a forming unit configured to form an update schedule representing an order of updating the first and second respective likelihoods in order of increasing reliability, in accordance with the reliabilities;
    an updating unit configured to update the first and second respective likelihoods in the order represented by the update schedule, with the low density parity check matrix;
    a discriminating unit configured to execute hard decision of the likelihoods updated by the updating unit; and
    a checking unit configured to execute parity check of a discrimination result of the discriminating unit, to obtain the code data.

2. The decoder according to claim 1, wherein the detecting unit detects the reliabilities in accordance with magnitude of absolute values of the likelihoods of the bits included in the code data.

3. The decoder according to claim 1, wherein the detecting unit detects the reliabilities in accordance with column weights of columns corresponding to the likelihoods of the bits included in the code data.

4. The decoder according to claim 1, wherein the detecting unit divides the likelihoods into plural groups and detects reliabilities of the respective groups, in accordance with magnitude of absolute values of the likelihoods of the bits composing the code data; and
    the forming unit forms the update schedule representing an order of updating the likelihoods of the bits composing the code data, in order of group having lower reliability.

5. The decoder according to claim 1, wherein the acquisition unit acquires likelihoods of punctured bits composing the code data;
    the decoder further comprises a depuncturing unit configured to add the likelihoods of the punctured bits to the likelihoods of bits acquired by the acquisition unit; and
    the detecting unit detects the likelihoods of the punctured bits as likelihoods being lower in reliability than likelihoods of other bits.

6. The decoder according to claim 1, wherein the acquisition unit acquires likelihoods of bits composing the code data transmitted by multi level modulation allocating a plurality of bits to a single signal point; and
    the detecting unit detects likelihoods of first bits of the bits allocated to the signal point, to which where errors are liable to occur are allocated, as likelihoods being lower in reliability than likelihoods of second bits of the allocated bits, to which other labels are allocated.

7. The decoder according to claim 1, wherein the acquisition unit acquires the likelihoods of the bits composing the code data by demodulating receive signals, and executes iterative demodulation using the likelihoods updated by the updating unit;
    the decoder further comprises a time detecting unit configured to detect number of times of the iterative demodulation executed by the acquisition unit; and
    the forming unit forms the update schedule representing the order of updating with priority the likelihoods having lower reliabilities, in accordance with the reliabilities, without separating the likelihoods of the data bits and the likelihoods of the parity bits if the number of times is smaller than a preset value, and forms the update schedule representing the order of updating with priority the likelihoods of the parity bits if the number of times reaches the preset value.

8. The decoder according to claim 1, wherein the forming unit forms the update schedule representing the order of updating with priority the likelihoods corresponding to the parity bits, of the likelihoods of the respective bits composing the code data, in accordance with the reliabilities, and then forms the update schedule representing the order of updating with priority the likelihoods of the data bits having lower reliabilities, in accordance with the reliabilities.

9. A decoding method comprising:
    acquiring first respective likelihoods of data bits and second respective likelihoods of parity bits, the data bits and the parity bits included in code data obtained by LDPC-encoding the data bits with a low density parity check matrix;

detecting reliabilities of the first respective likelihoods and the second respective likelihoods;

forming, with a decoder, an update schedule representing an order of updating the first and second respective likelihoods in order of increasing reliability, in accordance with the reliabilities;

updating the first and second respective likelihoods in the order represented by the update schedule, with the low density parity check matrix;

executing hard decision of the likelihoods updated by the updating; and executing parity check of a result of the hard decision, to obtain the code data.

10. The decoding method according to claim 9, wherein the detecting detects the reliabilities in accordance with magnitude of absolute values of the likelihoods of the bits included in the code data.

11. The decoding method according to claim 9, wherein the detecting detects the reliabilities in accordance with column weights of columns corresponding to the likelihoods of the bits included in the code data.

12. The decoding method according to claim 9, wherein the detecting divides the likelihoods into plural groups and detects reliabilities of the respective groups, in accordance with magnitude of absolute values of the likelihoods of the bits composing the code data; and the forming forms the update schedule representing an order of updating the likelihoods of the bits composing the code data, in order of group having lower reliability.

13. The decoding method according to claim 9, wherein the acquiring acquires likelihoods of punctured bits composing the code data;

the decoding method further comprises a depuncturing configured to add the likelihoods of the punctured bits to the likelihoods of bits acquired by the acquiring; and the detecting detects the likelihoods of the punctured bits as likelihoods being lower in reliability than likelihoods of other bits.

14. The decoding method according to claim 9, wherein the acquiring acquires likelihoods of bits composing the code data transmitted by multi level modulation allocating a plurality of bits to a single signal point; and the detecting detects likelihoods of first bits of the bits allocated to the signal point, to which where errors are liable to occur are allocated, as likelihoods being lower in reliability than likelihoods of second bits of the allocated bits, to which other labels are allocated.

15. A non-transitory computer-readable medium having embedded thereon computer-executable instructions, wherein the instructions, when executed by a processor, cause the processor to perform a method comprising:

(a) acquiring first respective likelihoods of data bits and second respective likelihoods of parity bits, the data bits and the parity bits included in code data obtained by LDPC-encoding the data bits with a low density parity check matrix;

(b) detecting reliabilities of the first respective likelihoods and the second respective likelihoods;

(c) forming an update schedule representing an order of updating the first and second respective likelihoods in order of increasing reliability, in accordance with the reliabilities;

(d) updating the first and second respective likelihoods in the order represented by the update schedule, with the low density parity check matrix;

(e) executing a hard decision of the likelihoods updated by the updating; and (f) executing a parity check of a discrimination result of the hard decision, to obtain the code data.

16. The computer-readable medium according to claim 15, wherein the step (b) of detecting reliabilities includes detecting the reliabilities in accordance with magnitude of absolute values of the likelihoods of the bits included in the code data.

17. The computer-readable medium according to claim 15, wherein the step (b) of detecting reliabilities includes detecting the reliabilities in accordance with column weights of columns corresponding to the likelihoods of the bits included in the code data.

18. The computer-readable medium according to claim 15, wherein the step (b) of detecting reliabilities includes dividing the likelihoods into plural groups and detecting reliabilities of the respective groups, in accordance with magnitude of absolute values of the likelihoods of the bits composing the code data; and the step (c) of forming an update schedule includes forming the update schedule representing an order of updating the likelihoods of the bits composing the code data, in order of group having lower reliability.

19. The computer-readable medium according to claim 15, wherein the step (a) of acquiring the first respective likelihoods includes acquiring likelihoods of punctured bits composing the code data;

the method further comprises adding the likelihoods of the punctured bits to the likelihoods of bits acquired by the step (a) of acquiring the first respective likelihoods; and the step (b) of detecting reliabilities includes detecting the likelihoods of the punctured bits as likelihoods being lower in reliability than likelihoods of other bits.

20. The computer-readable medium according to claim 15, wherein the step (a) of acquiring the first respective likelihoods includes acquiring likelihoods of bits composing the code data transmitted by multi level modulation allocating a plurality of bits to a single signal point; and the step (b) of detecting reliabilities includes detecting likelihoods of first bits of the bits allocated to the signal point, to which where errors are liable to occur are allocated, as likelihoods being lower in reliability than likelihoods of second bits of the allocated bits, to which other labels are allocated.

21. A decoder comprising:

an acquisition unit configured to acquire first respective likelihoods of data bits and second respective likelihoods of parity bits, the data bits and the parity bits included in code data obtained by LDPC-encoding the data bits with a low density parity check matrix;

a detecting unit configured to detect column weights of columns corresponding to the likelihoods of the bits included in the code data, the columns being included in the low density parity check matrix;

a forming unit configured to form an update schedule representing an order of updating the likelihoods of the bits in order of decreasing the column weights;

an updating unit configured to update the first and second respective likelihoods in the order represented by the update schedule, with the low density parity check matrix;

a discriminating unit configured to execute hard decision of the likelihoods updated by the updating unit; and a checking unit configured to execute parity check of a discrimination result of the discriminating unit, to obtain the code data.

22. A decoding method comprising:

acquiring first respective likelihoods of data bits and second respective likelihoods of parity bits, the data bits and the parity bits included in code data obtained by LDPC-encoding the data bits with a low density parity check matrix;

detecting column weights of columns corresponding to the likelihoods of the bits included in the code data, the columns being included in the low density parity check matrix;

forming, with a decoder, an update schedule representing an order of updating the likelihoods of the bits in order of decreasing the column weights;

updating the first and second respective likelihoods in the order represented by the update schedule, with the low density parity check matrix;

executing hard decision of the likelihoods updated by the updating; and executing parity check of a discrimination result of the hard decision, to obtain the code data.

23. A non-transitory computer-readable medium having embedded therein computer executable instructions, wherein the instructions, when executed by a processor, cause the processor to perform a method comprising:

acquiring first respective likelihoods of data bits and second respective likelihoods of parity bits, the data bits and the parity bits included in code data obtained by LDPC-encoding the data bits with a low density parity check matrix;

detecting column weights of columns corresponding to the likelihoods of the bits included in the code data, the columns being included in the low density parity check matrix;

forming an update schedule representing an order of updating the likelihoods of the bits in order of decreasing the column weights;

updating the first and second respective likelihoods in the order represented by the update schedule, with the low density parity check matrix;

executing hard decision of the likelihoods updated by the updating; and executing parity check of a discrimination result of the hard decision, to obtain the code data.

* * * * *